US012628539B2

(12) United States Patent
Tian et al.

(10) Patent No.: US 12,628,539 B2
(45) Date of Patent: May 12, 2026

(54) DISPLAY APPARATUS AND ELECTRONIC DEVICE

(71) Applicant: Honor Device Co., Ltd., Shenzhen (CN)

(72) Inventors: Zheng Tian, Shenzhen (CN); Shuai Zhang, Shenzhen (CN); Haiming He, Shenzhen (CN)

(73) Assignee: HONOR DEVICE CO., LTD., Shenzhen (CN)

( * ) Notice: Subject to any disclaimer, the term of this patent is extended or adjusted under 35 U.S.C. 154(b) by 449 days.

(21) Appl. No.: 18/269,711

(22) PCT Filed: Dec. 27, 2022

(86) PCT No.: PCT/CN2022/142496
§ 371 (c)(1),
(2) Date: Jun. 26, 2023

(87) PCT Pub. No.: WO2023/207183
PCT Pub. Date: Nov. 2, 2023

(65) Prior Publication Data
US 2024/0407239 A1 Dec. 5, 2024

(30) Foreign Application Priority Data

Apr. 27, 2022 (CN) .......................... 202210453882.1

(51) Int. Cl.
*H10K 59/121* (2023.01)
*G02F 1/13* (2006.01)
(Continued)

(52) U.S. Cl.
CPC ....... *H10K 59/8792* (2023.02); *G02F 1/1323* (2013.01); *G02F 1/16757* (2019.01); *H10K 59/1213* (2023.02); *H10K 59/1216* (2023.02)

(58) Field of Classification Search
CPC ........... H10K 59/8792; H10K 59/1213; H10K 59/1216; H10K 59/126; G02F 1/1676;
(Continued)

(56) References Cited

U.S. PATENT DOCUMENTS 11,086,150 B2 8/2021 You et al.
2019/0094576 A1 3/2019 Wang et al.
(Continued)

FOREIGN PATENT DOCUMENTS

CN 106019430 A 10/2016
CN 107621722 A 1/2018
(Continued)

*Primary Examiner* — Thanhha S Pham
(74) *Attorney, Agent, or Firm* — Slater Matsil, LLP

(57) ABSTRACT

This application provides a display apparatus and an electronic device. The display apparatus includes a display panel, a shielding layer, and a light adjustment layer that are sequentially stacked from bottom to top. A plurality of monochrome pixels are distributed on the display panel. The shielding layer includes a light shielding structure and a plurality of through holes, the light shielding structure shields a first part of light, and the through holes are configured to allow a second part of light and a third part of light to pass through. An acute angle between the first part of light and a plane on which the display panel is located is less than a preset angle. The light adjustment layer includes a plurality of ink capsules.

17 Claims, 13 Drawing Sheets

(51) Int. Cl.
 *G02F 1/16757* (2019.01)
 *H10K 59/80* (2023.01)
(58) Field of Classification Search
 CPC ...... G02F 1/1685; G02F 1/1323; G02F 1/167;
 G02F 1/16757
 See application file for complete search history.

(56) References Cited

U.S. PATENT DOCUMENTS

| | | | |
|---|---|---|---|
| 2020/0341343 A1 | 10/2020 | You et al. | |
| 2021/0181549 A1 | 6/2021 | Kim et al. | |
| 2021/0397062 A1 | 12/2021 | Hsiang et al. | |
| 2023/0205038 A1* | 6/2023 | Choi ................... G02F 1/1676 |
| | | | 359/296 |

FOREIGN PATENT DOCUMENTS

| | | | |
|---|---|---|---|
| CN | 108646493 | A | 10/2018 |
| CN | 109564366 | A | 4/2019 |
| CN | 109991791 | A | 7/2019 |
| CN | 212341653 | U | 1/2021 |
| CN | 212781585 | U | 3/2021 |
| CN | 213634038 | U | 7/2021 |
| CN | 113267924 | A | 8/2021 |
| CN | 113985678 | A | 1/2022 |
| GB | 2499634 | A | 8/2013 |
| JP | 2015141742 | A | 8/2015 |
| KR | 20190053571 | A | 5/2019 |
| WO | 2017156700 | A1 | 9/2017 |
| WO | 2018171191 | A1 | 9/2018 |

* cited by examiner

2032

2032

2033

2033

2033

2032

2033

2032

2033

DISPLAY APPARATUS AND ELECTRONIC DEVICE

CROSS-REFERENCE TO RELATED APPLICATIONS

This application is a national stage of International Application No. PCT/CN2022/142496, filed on Dec. 27, 2022, which claims priority to Chinese Patent Application No. 202210453882.1, filed on Apr. 27, 2022. The disclosures of both of the aforementioned applications are hereby incorporated by reference in their entireties.

TECHNICAL FIELD

This application relates to the field of terminal technologies, and in particular, to a display apparatus and an electronic device.

BACKGROUND

A current electronic device usually has a display apparatus, to implement a display function of the electronic device. Light emitted from the display apparatus enters eyes of a user, so that the user can view content displayed on the electronic device.

In different application scenarios of the electronic device, the user has different requirements for a function of the display apparatus. For example, when the user is in an outdoor scenario, emergent light of the display apparatus needs to have a small emergent angle, to reduce cases in which content displayed on the electronic device is peeped at, so that the electronic device has a peeping prevention function. When the user is in a home scenario, emergent light of the display apparatus needs to have a large emergent angle, so that the user views displayed content on the electronic device at different angles.

Therefore, currently, there is an urgent need for a display apparatus that has both a peeping prevention state and a non-peeping prevention state, so that the electronic device has a peeping prevention function and a non-peeping prevention function.

SUMMARY

To resolve the foregoing problem, this application provides a display apparatus and an electronic device, so that an electronic device has a peeping prevention function and a non-peeping prevention function.

According to a first aspect, this application provides a display apparatus applied to an electronic device. The electronic device includes but is not limited to a mobile phone, a notebook computer, a wearable electronic device (for example, a smartwatch), a tablet computer, an augmented reality (augmented reality, AR) device, a virtual reality (virtual reality, VR) device, and the like. The display apparatus includes a display panel, a shielding layer, and a light adjustment layer that are sequentially stacked from bottom to top. A plurality of monochrome pixels are distributed on the display panel, and the display panel is configured to emit light. The shielding layer includes a light shielding structure and a plurality of through holes, the light shielding structure is configured to shield a first part of light, and an acute angle between the first part of light and a plane on which the display panel is located is less than a preset angle. The plurality of through holes are configured to allow a second part of light and a third part of light to pass through, an acute angle between the second part of light and the plane on which the display panel is located is greater than or equal to the preset angle, and the third part of light is perpendicular to the plane on which the display panel is located. The light adjustment layer includes a plurality of ink capsules, and each ink capsule includes a plurality of ink particles. The light adjustment layer is configured to: control the ink particles to accumulate on one of a left side or a right side of the ink capsule in which the ink particles are located, so that the second part of light and the third part of light that pass through the plurality of through holes in the shielding layer directly pass through the ink capsule; or control the ink particles to be laid flat, in the ink capsule in which the ink particles are located, in a direction parallel to the plane on which the display panel is located, so that the ink particles scatter the second part of light and the third part of light that pass through the plurality of through holes in the shielding layer.

When the display apparatus provided in this application implements a peeping prevention function, the shielding layer shields the first part of light emitted from the display panel, and the light adjustment layer controls the ink particles to accumulate on one of the left side or the right side of the ink capsule in which the ink particles are located, so that light passing through the through hole in the shielding layer directly passes through the ink capsule and is not scattered. The acute angle between the shielded first part of light and the plane on which the display panel is located is less than the preset angle, the acute angle between the second part of light passing through the through hole and the plane on which the display panel is located is greater than or equal to the preset angle, and the third part of light passing through the through hole is perpendicular to the plane on which the display panel is located, that is, the second part of light and the third part of light are collimated light, so that light passing through the ink capsule is also collimated light. Therefore, displayed content cannot be viewed from a side surface of the display apparatus, and the displayed content can be viewed only from a front surface of the display apparatus, thereby implementing a peeping prevention function. When the display apparatus does not need to implement peeping prevention, and switches to a non-peeping prevention state, the light adjustment layer controls the ink particles to be laid flat, in the ink capsule in which the ink particles are located, in the direction parallel to the plane on which the display panel is located, so that the ink particles scatter the second part of light and the third part of light that pass through the through hole in the shielding layer, and after being emitted from the light adjustment layer, the second part of light and the third part of light change from collimated light to light having a plurality of different emergent angles. In this case, light emitted from the light adjustment layer includes both light emitted at a small angle and light emitted at a large angle, to help a user view displayed content on the display apparatus at different angles. In conclusion, according to the solution provided in this application, the electronic device has a peeping prevention function and a non-peeping prevention function, and can switch between the two functions based on a requirement of a user.

In a possible implementation, the light adjustment layer includes a first control electrode layer, an ink particle layer, and a second control electrode layer that are sequentially stacked in a direction away from the shielding layer. The first control electrode layer includes a plurality of electrode pairs, each electrode pair includes a first electrode and a second electrode, the first electrodes and the second electrodes are laid flat in the direction parallel to the plane on which the display panel is located, and light passing through the shielding layer can pass through a region between the first electrode and the second electrode. The ink particle layer includes the plurality of ink capsules. The second control electrode layer is made of a light-transmissive material. The first control electrode layer is configured to carry no charge, and the first electrode and the second electrode are configured to generate a voltage difference, to control the ink particles to accumulate on one of the left side or the right side of the ink capsule in which the ink particles are located. The first control electrode layer is further configured to carry a charge of a same type as a charge of the ink particle, and the first electrode and the second electrode each are further configured to carry a charge of a type different from that of the charge of the ink particle, to control the ink particles to be laid flat, in the ink capsule in which the ink particles are located, in the direction parallel to the plane on which the display panel is located.

In a possible implementation, each electrode pair in the first control electrode layer is made of an opaque material. In this case, the first control electrode layer can cooperate with the light shielding structure in the adjacent shielding layer to jointly shield the first part of light, that is, shield light forming an acute angle less than the preset angle with the plane on which the display panel is located, to improve a function of preventing screen peeping.

In a possible implementation, the first control electrode layer further includes an insulating structure. The insulating structure is made of a transparent material, and the plurality of electrode pairs are etched on the insulating structure.

In a possible implementation, the light shielding structure is a light shielding layer, and the light shielding layer is made of an opaque material. The light shielding layer includes a plurality of through holes, and the plurality of through holes are configured to allow the second part of light and the third part of light to pass through. The acute angle between the second part of light and the plane on which the display panel is located is greater than or equal to the preset angle, and the third part of light is perpendicular to the plane on which the display panel is located.

In a possible implementation, a location of each through hole corresponds to one monochrome pixel on the display panel. Considering that in actual application, if each through hole corresponds to a plurality of monochrome pixels, an aperture of the through hole is large, and an offset voltage required when the electrode pair controls the ink particle to offset is high, which increases power consumption. However, if a plurality of through holes correspond to one monochrome pixel, the aperture of the through hole is small, a process is difficult, and light shielding is serious, which causes an obvious decrease in brightness. Therefore, a location of each through hole corresponds to one monochrome pixel on the display panel.

In a possible implementation, the light shielding structure is a plurality of shielding members arranged in an array. Each shielding member is made of an opaque material. Each shielding member is distributed below the first electrode and the second electrode.

In a possible implementation, each shielding member is in a surrounding shape, each shielding member forms one through hole through surrounding, the through hole is configured to allow the second part of light and the third part of light to pass through, the acute angle between the second part of light and the plane on which the display panel is located is greater than or equal to the preset angle, and the third part of light is perpendicular to the plane on which the display panel is located.

In a possible implementation, a location of each through hole corresponds to one monochrome pixel on the display panel. Considering that in actual application, if a plurality of through holes correspond to one monochrome pixel, the through hole is small, a process is difficult, and light shielding is serious, which causes an obvious decrease in brightness. Therefore, a location of each through hole corresponds to one monochrome pixel on the display panel.

In a possible implementation, a location of each through hole corresponds to one or more monochrome pixels on the display panel, and at least two electrode pairs are disposed at a corresponding location in the first control electrode layer above each through hole.

In a possible implementation, the plurality of ink capsules included in the ink particle layer are laid flat in the direction parallel to the plane on which the display panel is located.

In a possible implementation, the ink particle layer further includes a base structure, the base structure is made of a light-transmissive material, and the base structure includes a plurality of blind holes. Each blind hole is configured to fill one or more ink capsules.

In a possible implementation, the ink particle layer further includes a base structure, and the base structure includes a plurality of through holes. Each through hole is configured to fill one or more ink capsules.

In a possible implementation, the first control electrode layer further includes a first control circuit. The first control circuit includes a first branch and a second branch that are arranged at intervals, and a quantity of the first branches is equal to a quantity of the second branches. The plurality of electrode pairs include a plurality of groups of electrode pairs. Each first branch is configured to supply power to a first electrode in one group of electrode pairs, and each second branch is configured to supply power to a second electrode in one group of electrode pairs.

In a possible implementation, the first control circuit further includes a plurality of control units, and each control unit is configured to drive one electrode pair. Each control unit includes one thin film transistor and one capacitor.

In a possible implementation, considering a light-absorbing feature of the ink particle, a band gap of a base material of the ink particle may be approximately 2.8 eV (for example, the band gap is (2.6-3.0 E) ev), and a material used for the ink particle includes but is not limited to tungsten oxide, bismuth oxide, titanium oxide, or the like, and a related derivative material.

In a possible implementation, a light-absorbing cutoff wavelength range of the ink particle is 445 nanometers to 455 nanometers. To be specific, when light emitted from the first control electrode layer is projected onto the ink particle, in addition to scattering the light, the ink particle further absorbs light whose wavelength is less than a cutoff wavelength (high-energy blue-violet light), so that the electronic device has a function of eye protection with low-blue light, to protect eye health of a user.

According to a second aspect, this application provides an electronic device, and the electronic device includes the display apparatus provided in the foregoing implementations. When the display apparatus implements a peeping prevention function, the shielding layer shields the first part of light emitted from the display panel, and the light adjustment layer controls the ink particles to accumulate on one of the left side or the right side of the ink capsule in which the ink particles are located, so that light passing through the shielding layer directly passes through the ink capsule and is not scattered. Because the acute angle between the shielded first part of light and the plane on which the display panel is located is less than the preset angle, displayed content cannot be viewed from a side surface of the display apparatus, and the displayed content can be viewed only from a front surface of the display apparatus, thereby implementing a peeping prevention function. When the display apparatus does not need to implement peeping prevention, and switches to a non-peeping prevention state, the light adjustment layer controls the ink particles to be laid flat, in the ink capsule in which the ink particles are located, in the direction parallel to the plane on which the display panel is located, so that the ink particles scatter the second part of light and the third part of light that pass through the through hole in the shielding layer, and after being emitted from the light adjustment layer, the second part of light and the third part of light change from collimated light to light having a plurality of different emergent angles. In this case, light emitted from the light adjustment layer includes both light emitted at a small angle and light emitted at a large angle, to help a user view displayed content on the display apparatus at different angles. In conclusion, according to the solution provided in this application, the electronic device has a peeping prevention function and a non-peeping prevention function, and can switch between the two functions based on a requirement of a user. In addition, the ink particle with a feature of absorbing blue-violet light is used, so that when light emitted from the first control electrode layer is projected onto the ink particle, the blue-violet light is absorbed by the ink particle. Therefore, the electronic device has a function of eye protection with low-blue light, to protect eye health of a user.

6

Figure 4A:
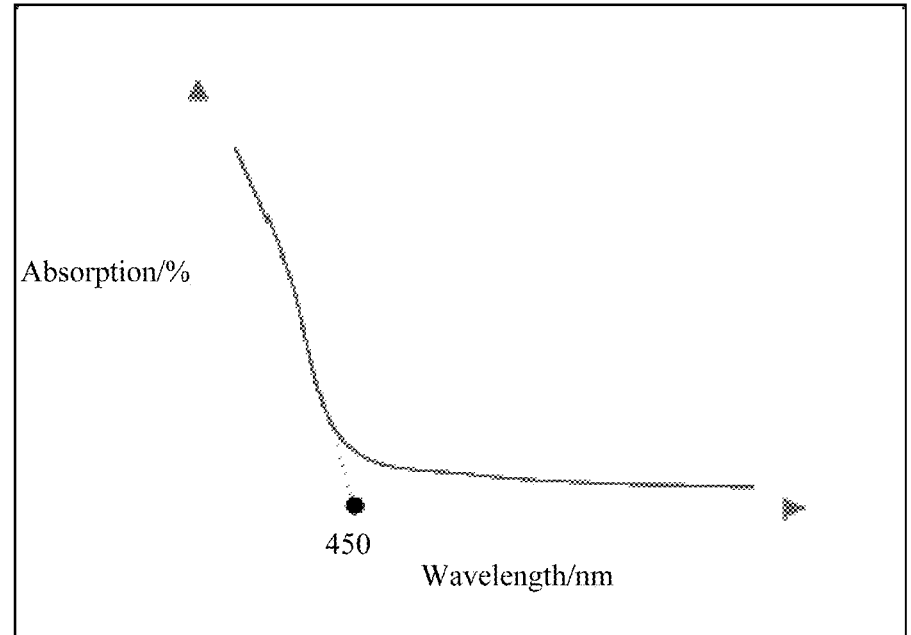
FIG. 4A is a schematic diagram of a typical absorption spectrum of a scattering particle according to an embodiment of this application.
Figure 4B:
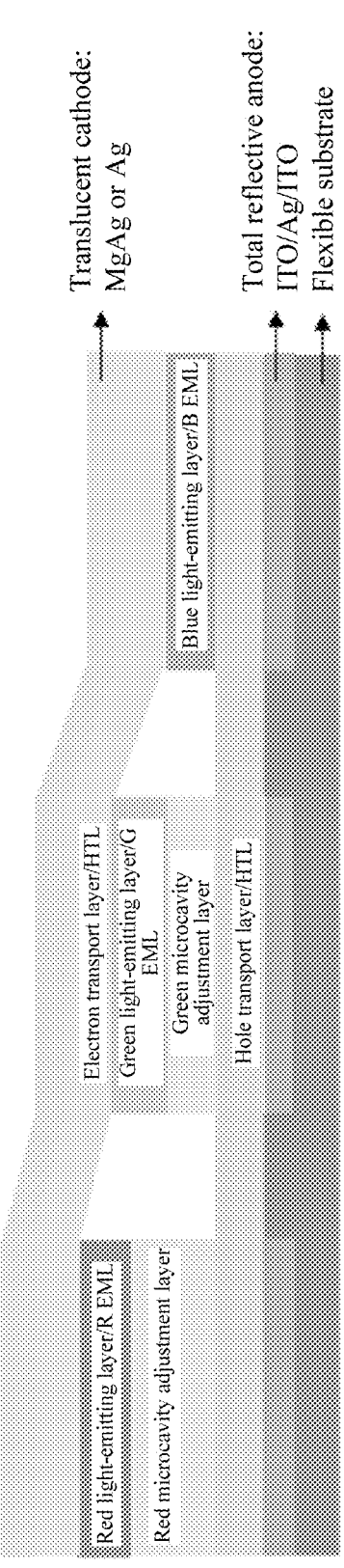
Figure 5:
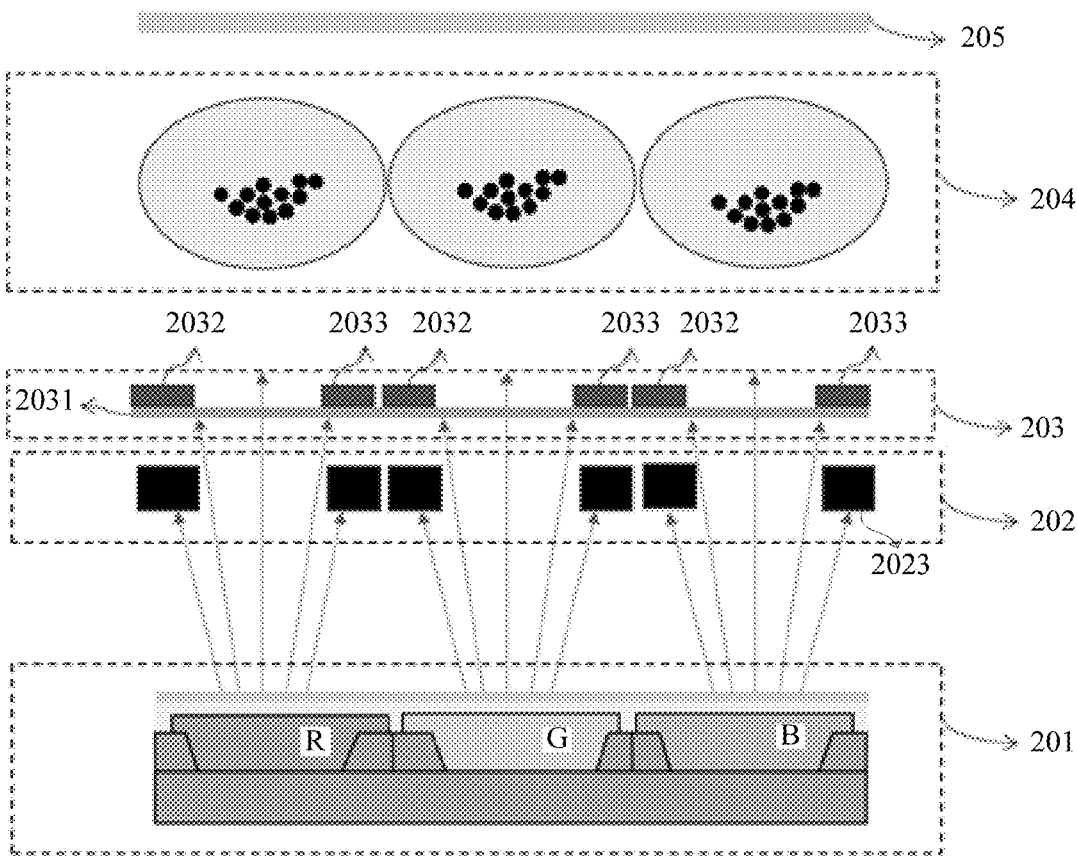
Figure 6:
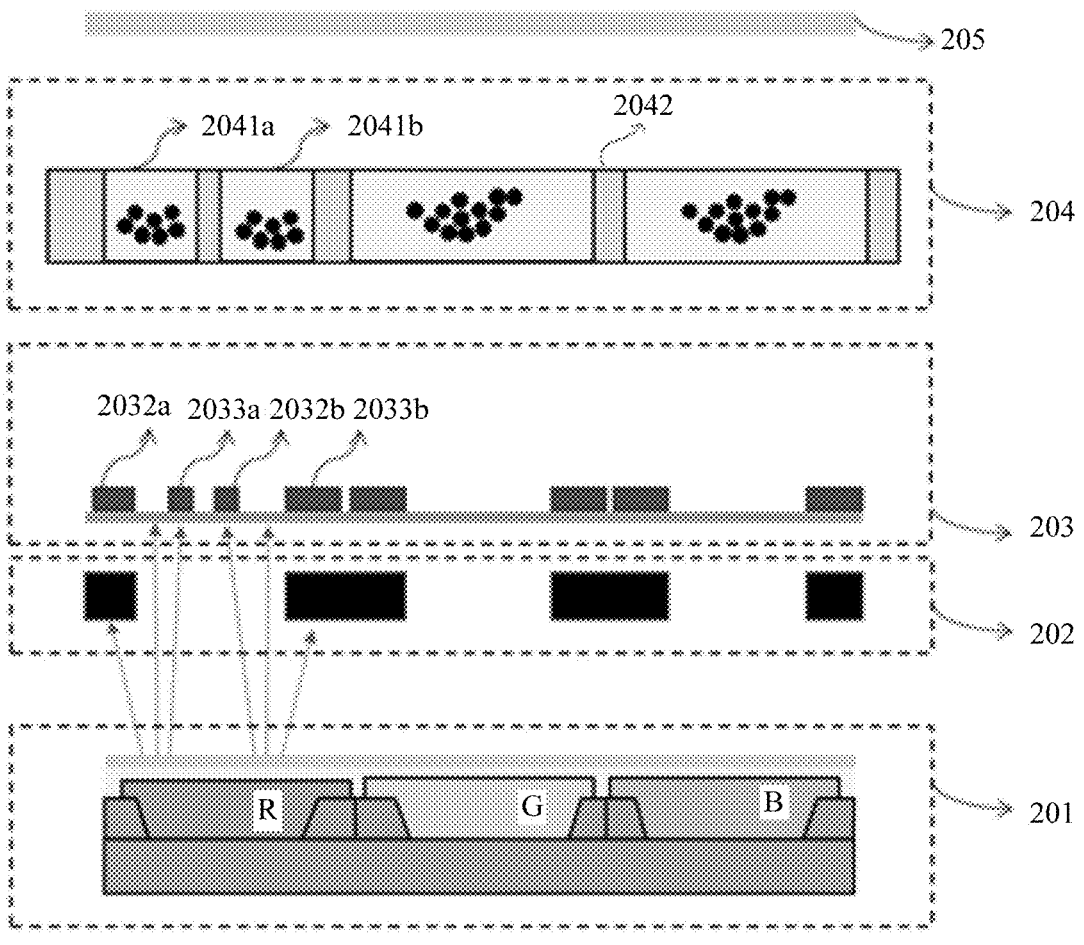
Figure 7A:
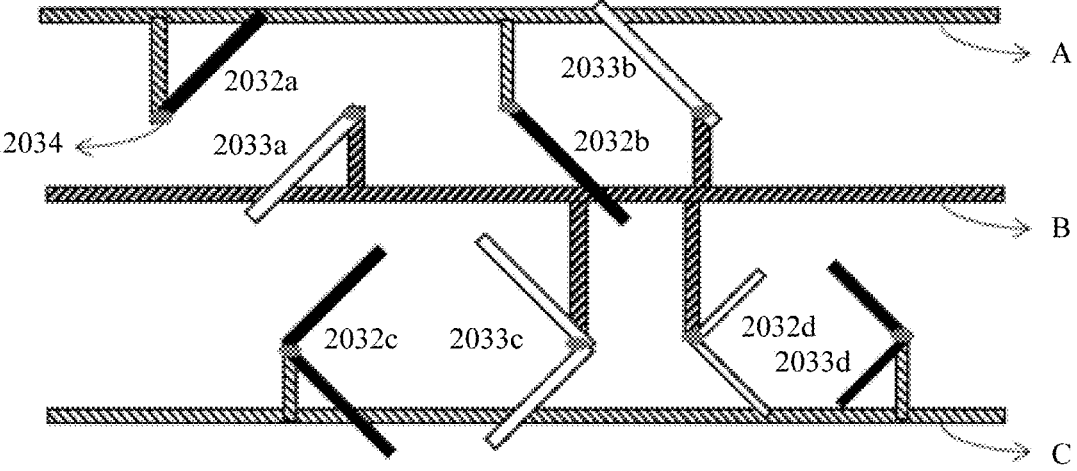
Figure 7B:
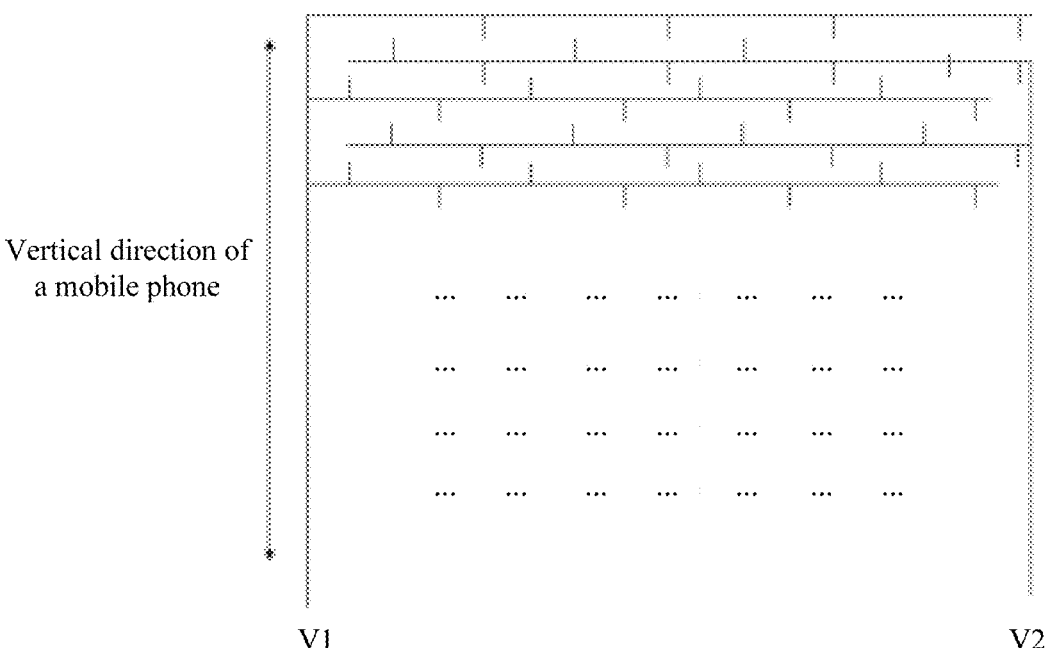
Figure 8A:
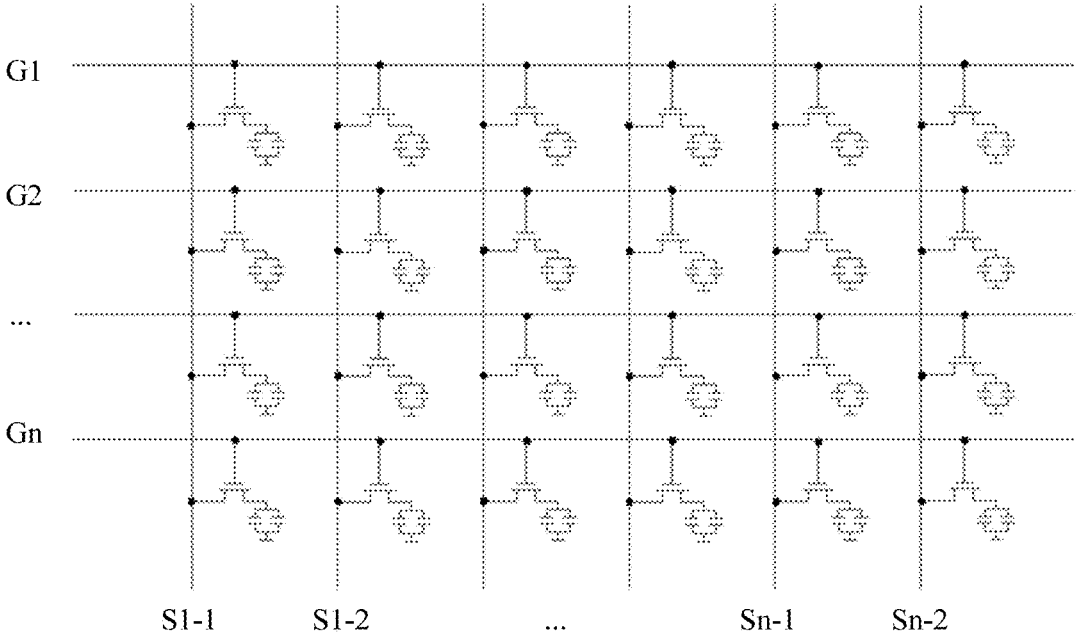
Figure 8B:
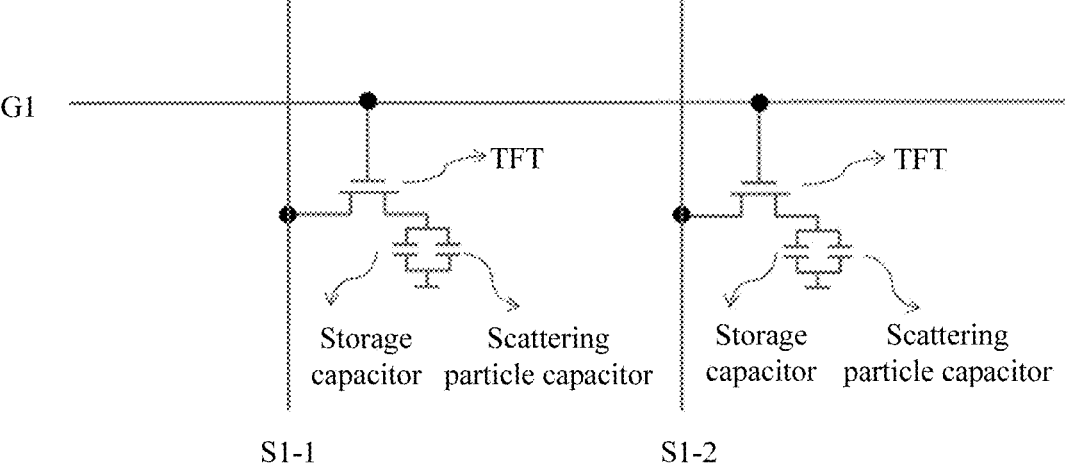

FIG. 4B is a schematic diagram of a structure of an OLED according to an embodiment of this application;

FIG. 5 is a partial schematic diagram of a side-view structure of a display apparatus according to another embodiment of this application;

FIG. 6 is a partial schematic diagram of a side-view structure of a display apparatus according to another embodiment of this application;

FIG. 7A is a schematic diagram of a first electrode layer and a first control circuit according to an embodiment of this application;

FIG. 7B is a schematic diagram of a first control circuit according to an embodiment of this application;

FIG. 8A is a schematic diagram of a first control circuit according to another embodiment of this application; and FIG. 8B is a schematic diagram of a control unit according to an embodiment of this application.

DETAILED DESCRIPTION OF ILLUSTRATIVE EMBODIMENTS

In embodiments of this application, words such as "example" or "for example" are used to represent giving examples, illustrations, or descriptions. Any embodiment or design solution described as "example" or "for example" in embodiments of this application should not be construed as being more preferred or advantageous than other embodiments or design solutions. Exactly, use of the words such as "example" or "for example" is intended to present a related concept in a specific manner.

In this specification of this application, words such as "first" and "second" are used merely for the purpose of description, and cannot be understood as an indication or implication of relative importance or an implicit indication of a quantity of indicated technical features.

In this application, unless otherwise specified and defined, the term "connection" should be understood in a broad sense. For example, a "connection" may be a fixed connection, may be a detachable connection, or may be integration; may be a direct connection; or may be an indirect connection implemented by using an intermediate medium.

The terms used in implementations of this application are merely intended to explain specific embodiments of this application and are not intended to limit this application. The following describes embodiments of this application in detail with reference to the accompanying drawings.

A display apparatus provided in this application is applied to an electronic device. The following describes a structure of the electronic device in implementation of this application.

A type of the electronic device is not specifically limited in embodiments of this application, and the electronic device may be a mobile phone, a notebook computer, a wearable electronic device (for example, a smartwatch), a tablet computer, an augmented reality (augmented reality, AR) device, a virtual reality (virtual reality, VR) device, or the like.

The following describes the electronic device by using a mobile phone as an example.

Figure 1A:
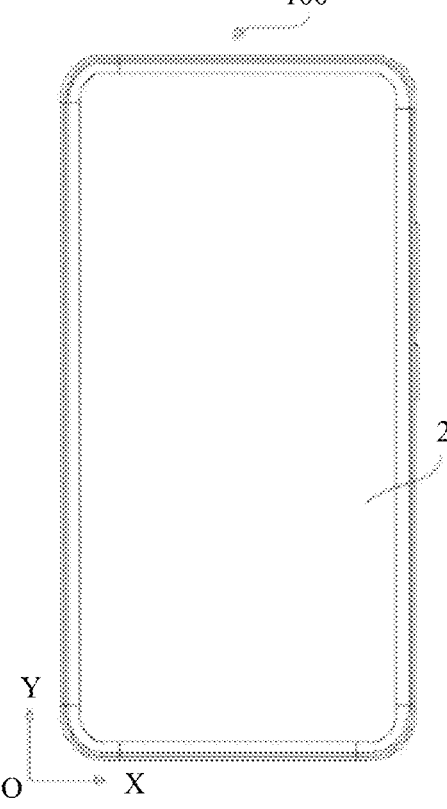
FIG. 1A is a schematic diagram of a structure of an electronic device according to an embodiment of this application.

Referring to FIG. 1A, FIG. 1A is a schematic diagram of a structure of an electronic device according to an embodiment of this application.

FIG. 1A is a schematic diagram of a structure of an electronic device 100.

As shown in FIG. 1, a surface that is of the electronic device 100 and that is used to implement a display function is located on an xoy plane.

For example, a front surface 2 of the mobile phone is the surface that implements the display function. Light is emitted from the front surface 2 of the electronic device 100, and enters eyes of a user, to implement the display function of the electronic device.

In the following description, a direction of a z axis points from a back surface of the electronic device 100 to the front surface of the electronic device 100.

Figure 1B:
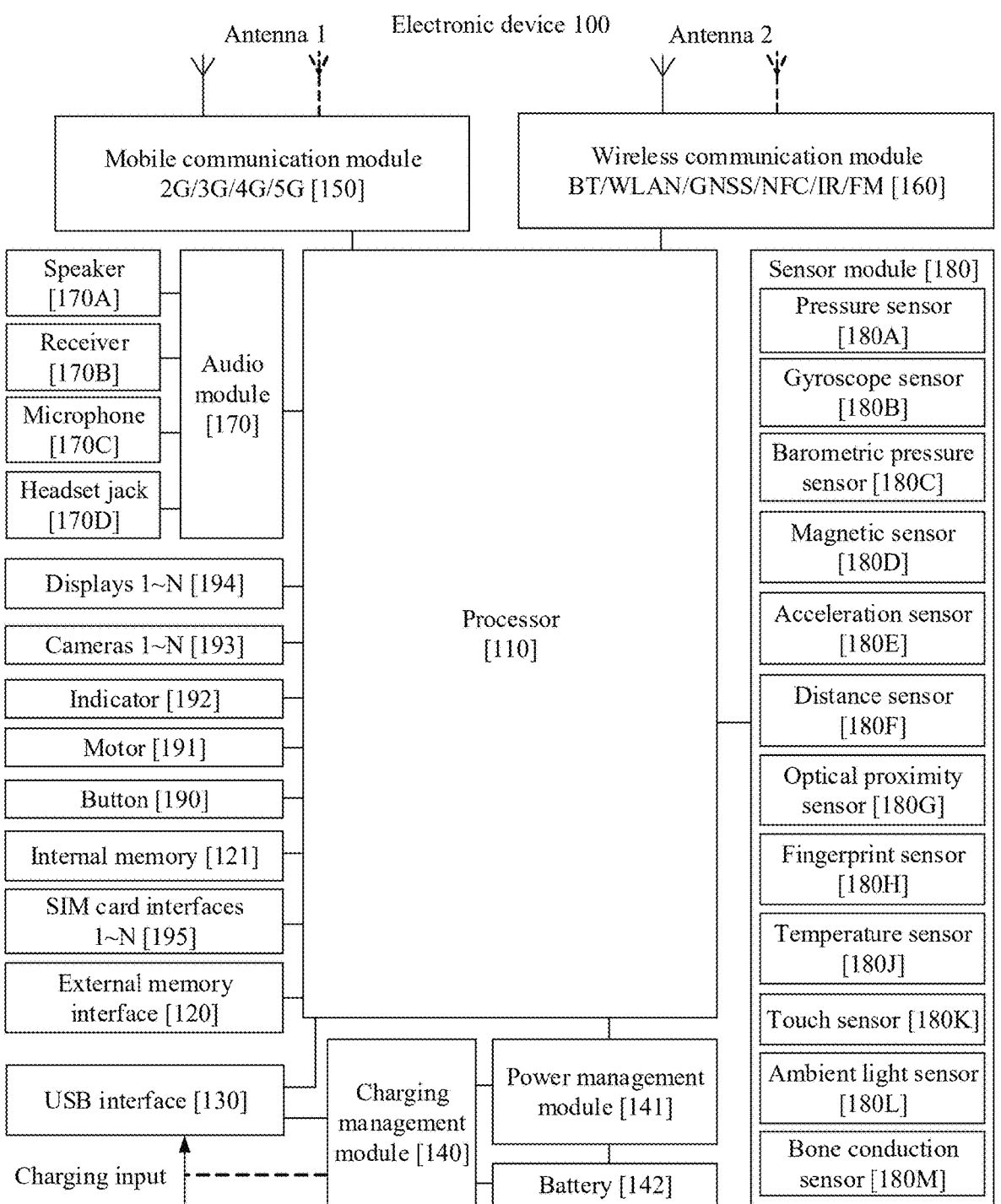
FIG. 1B is a schematic diagram of a hardware structure of an electronic device according to an embodiment of this application.

Referring to FIG. 1B, FIG. 1B is a schematic diagram of a hardware structure of an electronic device according to an embodiment of this application.

As shown in FIG. 1B, the electronic device 100 may include a processor 110, an external memory interface 120, an internal memory 121, a universal serial bus (universal serial bus, USB) interface 130, a charging management module 140, a power management module 141, a battery 142, an antenna 1, an antenna 2, a mobile communication module 150, a wireless communication module 160, an audio module 170, a speaker 170A, a receiver 170B, a microphone 170C, a headset jack 170D, a sensor module 180, a button 190, a motor 191, an indicator 192, a camera 193, a display 194, a subscriber identification module (subscriber identification module, SIM) card interface 195, and the like. The sensor module 180 may include a pressure sensor 180A, a gyroscope sensor 180B, a barometric pressure sensor 180C, a magnetic sensor 180D, an acceleration sensor 180E, a distance sensor 180F, an optical proximity sensor 180G, a fingerprint sensor 180H, a temperature sensor 180J, a touch sensor 180K, an ambient light sensor 180L, a bone conduction sensor 180M, and the like.

It can be understood that the structure illustrated in this embodiment of the present invention does not constitute a specific limitation on the electronic device 100. In some other embodiments of this application, the electronic device 100 may include more or fewer components than those shown in the figure, or combine some components, or split some components, or have different component arrangements. The components shown in the figure may be implemented by hardware, software, or a combination of software and hardware.

The electronic device 100 implements a display function by using a GPU, the display 194, an application processor, and the like. The GPU is a microprocessor for image processing, and is connected to the display 194 and the application processor. The GPU is configured to perform mathematical and geometric calculation, and is configured to render graphics. The processor 110 may include one or more GPUs that execute program instructions to generate or change display information.

The display 194 is configured to display an image, a video, or the like. The display 194 includes a display panel. The display panel may be a liquid crystal display (liquid crystal display, LCD), an organic light-emitting diode (organic light-emitting diode, OLED), an active-matrix organic light emitting diode or an active-matrix organic light emitting diode (active-matrix organic light emitting diode, AMOLED), a flexible light-emitting diode (flex light-emitting diode, FLED), a Miniled, a MicroLed, a Micro-oLed, a quantum dot light emitting diode (quantum dot light emitting diodes, QLED), or the like. In some embodiments, the electronic device 100 may include one or N displays 194, where N is a positive integer greater than 1.

To facilitate understanding of the technical solutions provided in the embodiments of this application, the following describes common application scenarios of the embodiments of this application.

The following uses an example in which the electronic device 100 is a mobile phone for description.

The mobile phone can be seen everywhere in people's lives, and a user uses the mobile phone in a plurality of scenarios. In different scenarios, the user has different requirements for a display function of the mobile phone.

In an outdoor scenario, when viewing content displayed on the mobile phone, the user pays more attention to whether the content displayed on the mobile phone is peeped at by another person. For example, when the user uses the mobile phone in a crowded place such as a bus station, a person around the user may peep at content displayed on the mobile phone of the user, causing privacy exposure of the user. When the user makes an electronic payment by using the mobile phone, a payment code displayed on the mobile phone may be captured by a person around the user, causing a property loss to the user. Therefore, in the foregoing scenarios, the mobile phone needs to have a peeping prevention function, that is, the mobile phone is in a peeping prevention mode.

An emergent angle of emergent light of a display apparatus is controlled to be decreased, for example, the emergent light of the display apparatus is controlled to be collimated light, to implement the peeping prevention function of the mobile phone.

Generally, in an outdoor scenario or the like, when the user views content displayed on the mobile phone, the user is in a state of viewing the front of the display apparatus. In this case, the emergent angle of the emergent light of the display apparatus is decreased, so that the user can normally view the content displayed on the mobile phone when viewing the front of the display apparatus. In addition, a risk that a person around the user peeps at, from another angle (an angle of not viewing the front of the display apparatus), the content displayed on the mobile phone is reduced, to implement the peeping prevention function of the mobile phone.

For example, in a home scenario or the like, the user may be in a plurality of different postures when the user views content displayed on the mobile phone. For example, the user may be in a sitting or lying posture, or a plurality of users simultaneously view content displayed on a same mobile phone. Therefore, in the foregoing scenarios, the mobile phone needs to have a large display angle, that is, the emergent angle of the emergent light of the display apparatus needs to be increased, so that the mobile phone is in a non-peeping prevention mode.

Therefore, currently, there is an urgent need for a display apparatus that has both a peeping prevention state and a non-peeping prevention state, so that the electronic device has a peeping prevention function and a non-peeping prevention function.

To resolve the foregoing technical problem, embodiments of this application provide a display apparatus and an electronic device, so that an electronic device has a peeping prevention function and a non-peeping prevention function.

The following clearly describes the technical solutions in the embodiments of this application with reference to the accompanying drawings in the embodiments of this application.

An embodiment of this application provides a display apparatus, which is specifically described below with reference to the accompanying drawings.

Figure 2:
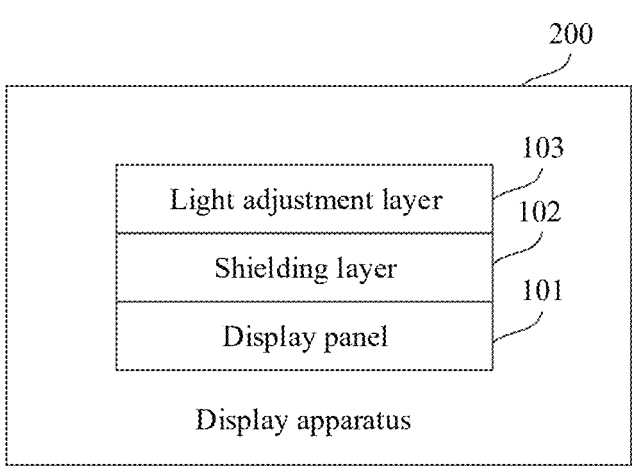
FIG. 2 is a schematic diagram of a side-view structure of a display apparatus according to an embodiment of this application.

Referring to FIG. 2, FIG. 2 is a schematic diagram of a side-view structure of a display apparatus according to an embodiment of this application.

A display apparatus 200 in this embodiment of this application is applied to an electronic device.

As shown in FIG. 2, the display apparatus 200 in this embodiment of this application includes a display panel 101, a shielding layer 102, and a light adjustment layer 103.

The display panel 101 is configured to emit light, and a plurality of monochrome pixels are distributed on the display panel 101.

Different monochrome pixels can emit light of a same color or different colors.

The shielding layer 102 includes a light shielding structure and a plurality of through holes.

The light shielding structure is configured to shield a first part of light emitted from the display panel 101, and the first part of light is light forming an acute angle less than a preset angle with a plane on which the display panel 101 is located.

The plurality of through holes are configured to allow a second part of light and a third part of light to pass through. An acute angle between the second part of light and the plane on which the display panel 101 is located is greater than or equal to the preset angle, and the third part of light is perpendicular to the plane on which the display panel 101 is located.

In other words, the second part of light and the third part of light emitted from the display panel 101 can sequentially pass through the shielding layer 102 and the light adjustment layer 103.

The light shielding structure in the shielding layer 102 shields light emitted from the display panel 101, specifically, light forming an acute angle less than the preset angle with the plane on which the display panel 101 is located is shielded.

For example, light A and light B are light emitted from the display panel 101, an acute angle formed between the light A and the plane on which the display panel 101 is located is larger, and an acute angle formed between the light B and the plane on which the display panel 101 is located is smaller.

In this case, the light A can be emitted from the shielding layer 102 through the through hole, but the light B is shielded by the light shielding structure and cannot be emitted from the shielding layer 102.

When an acute angle between light and the plane on which the display panel 101 is located is less than the preset angle, and the light is emitted from the display apparatus 200, content displayed on the electronic device is easily peeped at by another person.

Therefore, the shielding layer 102 can shield a part of light emitted from the display panel 101, to achieve a peeping prevention effect.

The light adjustment layer 103 includes a plurality of ink capsules, and each ink capsule includes a plurality of ink particles carrying charges.

The light adjustment layer 103 is configured to: control the ink particles to accumulate on one of a left side or a right side of the ink capsule in which the ink particles are located, so that the second part of light and the third part of light that pass through the through hole in the shielding layer 102 directly pass through the ink capsule; or control the ink particles to be laid flat, in the ink capsule in which the ink particles are located, in a direction parallel to the plane on which the display panel 101 is located, so that the ink particles scatter the second part of light and the third part of light that pass through the through hole in the shielding layer 102.

Light emitted from the display panel 101 is emitted to the light adjustment layer 103 after passing through the shielding layer 102.

The light adjustment layer 103 can control the ink particles in the ink capsule to be in two states, to control light emitted from the shielding layer 102.

First, the light adjustment layer 103 controls the ink particles to accumulate on one side of the ink capsule in which the ink particles are located, so that light from the shielding layer 102 directly passes through the light adjustment layer 103, and the light is slightly affected or is not affected by the ink particles.

In the foregoing case, the shielding layer 102 can shield the first part of light emitted from the display panel 101, and the second part of light and the third part of light that pass through the through hole are collimated light. In addition, the ink particles in the light adjustment layer 103 have little impact on the light from the shielding layer 102. Therefore, light passing through the ink capsule is also collimated light. In this case, displayed content cannot be viewed from a side surface of the display apparatus 200, and the displayed content can be viewed only from a front surface of the display apparatus 200, so that the display apparatus 200 can achieve a peeping prevention effect.

Second, the light adjustment layer 103 controls the ink particles to be laid flat, in the ink capsule in which the ink particles are located, in the direction parallel to the plane on which the display panel 101 is located, so that the ink particles scatter light passing through the through hole in the shielding layer 102.

In the foregoing case, after the second part of light and the third part of light pass through the through hole, the ink particles can scatter the second part of light and the third part of light, so that after being emitted from the light adjustment layer 103, the second part of light and the third part of light change from collimated light to light having a plurality of different emergent angles. In this case, light emitted from the light adjustment layer 103 includes both light emitted at a small angle and light emitted at a large angle, to help a user view displayed content on the display apparatus 200 at different angles.

In conclusion, the display apparatus in this embodiment of this application emits light by using the display panel; shields, by using the shielding layer, light emitted from the display panel at a large angle; and controls, by using the light adjustment layer, the ink particles to adjust light from the shielding layer, so that the display apparatus can process a peeping prevention state and a non-peeping prevention state, and the electronic device can switch between peeping prevention and non-peeping prevention.

The following provides description with reference to specific implementations.

Figure 3A:
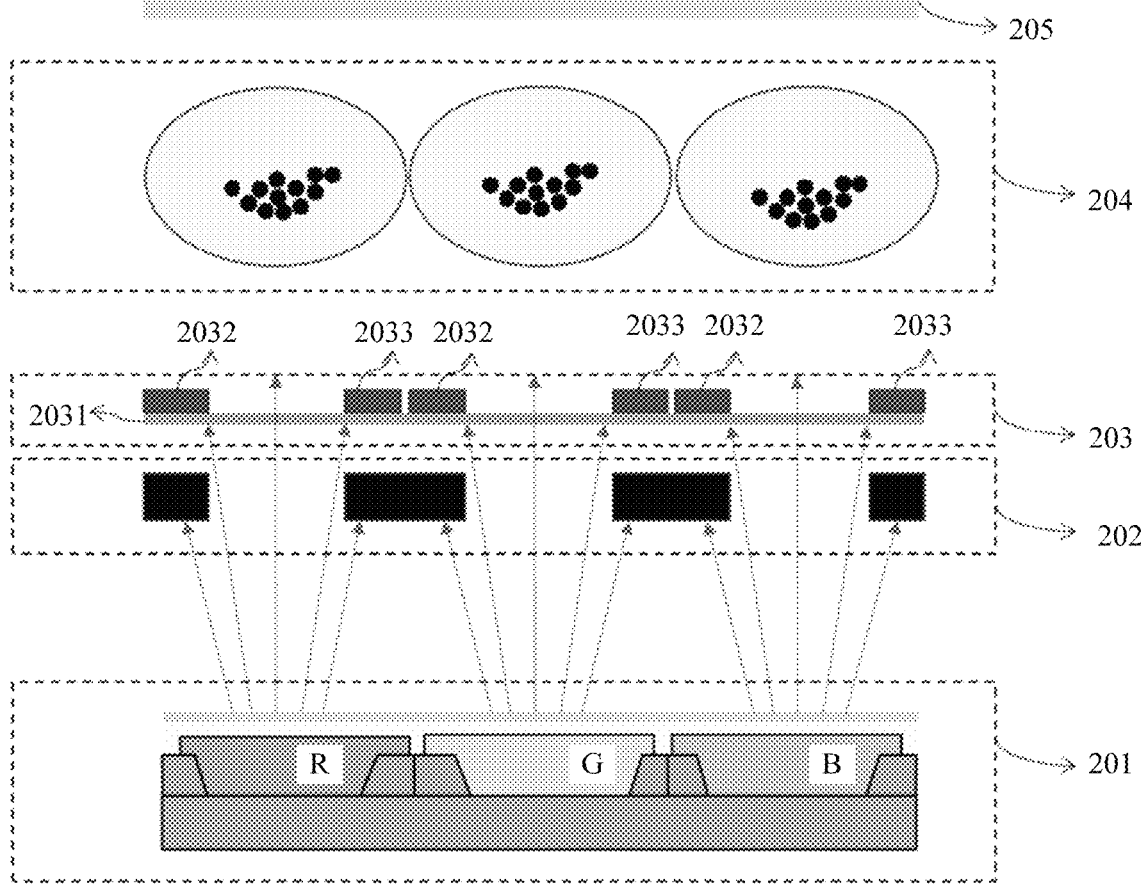
FIG. 3A is a partial schematic diagram of a side-view structure of a display apparatus according to an embodiment of this application.

Referring to FIG. 3A, FIG. 3A is a partial schematic diagram of a side-view structure of a display apparatus according to an embodiment of this application.

The electronic device 100 shown in FIG. 1A includes a display apparatus to implement a display function.

As shown in FIG. 1A, light is emitted outward from the display apparatus on an xoy plane, so that the electronic device 100 implements the display function.

FIG. 3A shows a partial side-view structure of a display apparatus.

In the following description, a direction along a z axis is the top, that is, an example in which an upper surface of the electronic device is a surface that is of the electronic device and that has the display function is used.

As shown in FIG. 3A, the display apparatus includes a display panel 201, a shielding layer 202, a first control electrode layer 203, an ink particle layer 204, and a second control electrode layer 205.

The display panel 201 is a light-emitting device. FIG. 3A is a schematic diagram of a structure of the display panel 201. In this embodiment, an example in which the display panel 201 is an organic light-emitting diode OLED is used for description. It can be understood that the display panel 201 may alternatively be a liquid crystal display LCD or the like.

Light is emitted from the OLED and transmitted upward, which means that after the light is emitted from the OLED, the light is transmitted directly above the OLED and obliquely above the OLED. In other words, the light emitted from the display panel 201 is usually scattering light.

In the OLED, there are red pixels, green pixels, and blue pixels that are regularly arranged. One of the red pixel, the green pixel, or the blue pixel may be referred to as a monochrome pixel.

FIG. 3A shows only a corresponding structure of one red pixel R, one blue pixel B, and one green pixel G in the OLED in the side-view structure of the display apparatus 200.

It can be understood that according to a monochrome pixel arrangement rule, a structure of the display apparatus 200 may be correspondingly extended (a structure in the display apparatus 200 may be correspondingly extended to extend the structure of the display apparatus 200).

As shown in FIG. 3A, the shielding layer 202, the first control electrode layer 203, the ink particle layer 204, and the second control electrode layer 205 are sequentially stacked above the OLED from bottom to top.

Figure 3B:
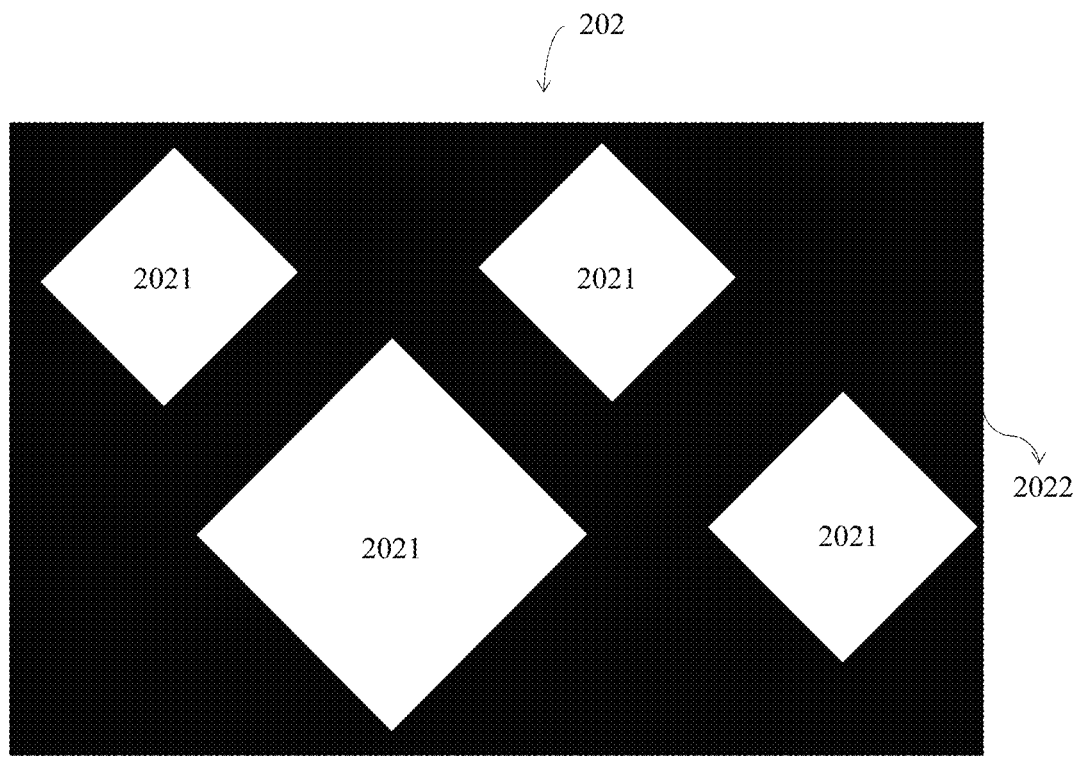
FIG. 3B is a schematic diagram of a top-view structure of a shielding layer according to an embodiment of this application.

Referring to FIG. 3B, FIG. 3B is a schematic diagram of a top-view structure of a shielding layer according to an embodiment of this application.

As shown in FIG. 3B, a light shielding structure in the shielding layer 202 is a light shielding layer 2022 in this case.

The light shielding layer 2022 is made of an opaque material. The light shielding layer 2022 includes a plurality of through holes 2021, and the plurality of through holes 2021 are configured to allow a second part of light and a third part of light to pass through. An acute angle between the second part of light and a plane on which the display panel is located is greater than or equal to a preset angle, and the third part of light is perpendicular to the plane on which the display panel is located, that is, the plurality of through holes 2021 are configured to allow collimated light to pass through. In this case, the light shielding layer 2022 is laid flat in a direction parallel to the plane on which the display panel is located.

The plurality of through holes 2021 are hollow structure in the z direction.

It can be understood that the plurality of through holes 2021 and the light shielding layer 2022 are merely used to describe the shielding layer 202. The plurality of through holes 2021 are not physical structures, but are hollow parts in the shielding layer 202.

Referring to FIG. 3A, the shielding layer 202 is located above the OLED.

One through hole 2021 in the shielding layer 202 corresponds to one monochrome pixel in the OLED. There is one through hole 2021 above each monochrome pixel.

After light emitted from the OLED reaches the shielding layer 202, the second part of light and the third part of light can pass through the plurality of through holes 2021 to be propagated upward. However, a first part of light is shielded when entering a non-through hole part in the shielding layer 202, and does not continue to be propagated upward. In a possible implementation, in the z-axis direction, an axis of the through hole 2011 overlaps an axis of a corresponding monochrome pixel, that is, the through hole 2011 is located directly above the corresponding monochrome pixel.

As shown in FIG. 3A, the first control electrode layer 203 is located above the shielding layer 202.

Figure 3C:
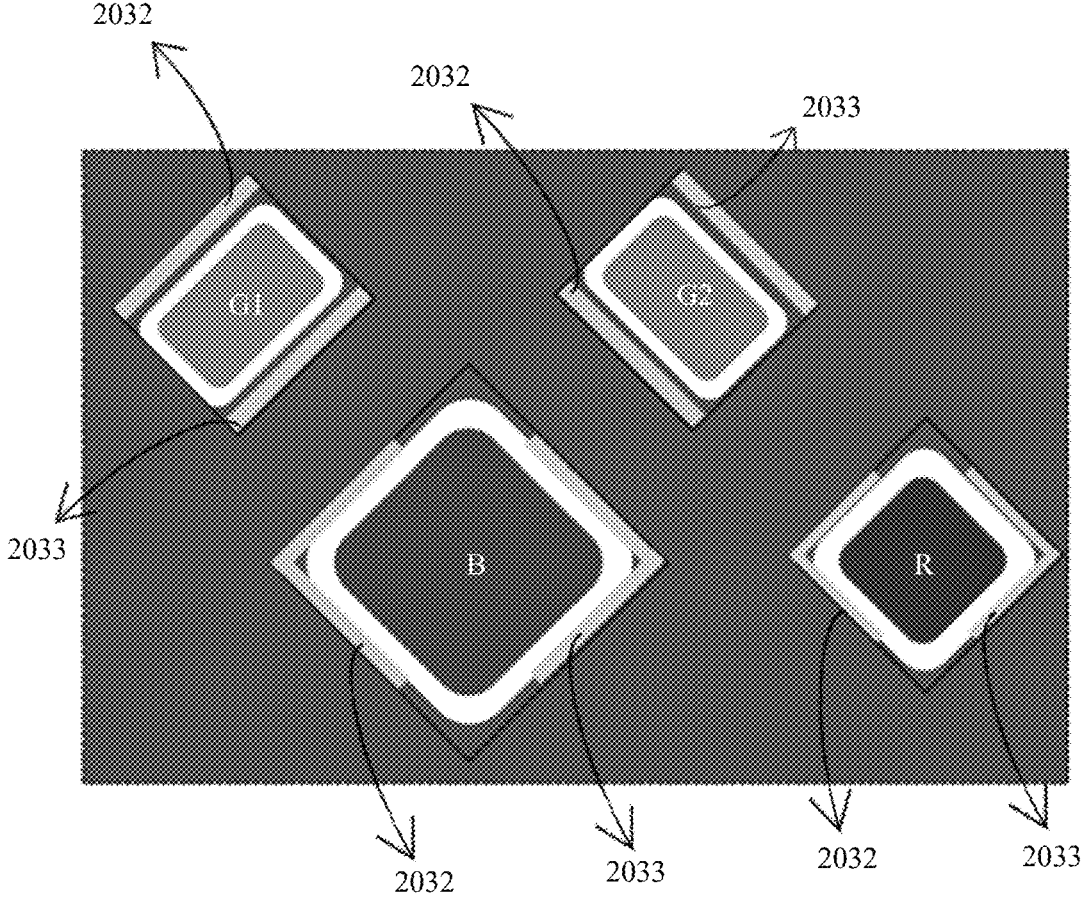
FIG. 3C is a schematic diagram of stacking of a display panel, a shielding layer, and a first control electrode layer according to an embodiment of this application.

Referring to FIG. 3C, FIG. 3C is a schematic diagram of stacking of a display panel, a shielding layer, and a first control electrode layer according to an embodiment of this application.

The first control electrode layer includes an insulating structure (corresponding to 2031 in FIG. 3A) and a plurality of electrode pairs. In some possible implementations, the electrode pairs in the first control electrode layer 203 may be formed on the insulating structure by using an etching process, to form the first control electrode layer.

One electrode pair includes one first electrode 2032 and one second electrode 2033, that is, the first electrode 2032 and the second electrode 2033 exist in pairs.

The insulating structure may be configured to fasten the plurality of electrode pairs.

For an electrode pair, the first electrode 2032 and the second electrode 2033 are disposed opposite to each other on the xoy plane.

A region between the first electrode 2032 and the second electrode 2033 is light-transmissive.

As shown in FIG. 3C, in a top-view direction of the display apparatus 200, a monochrome pixel exists between the first electrode 2032 and the second electrode 2033 in each electrode pair.

Referring to FIG. 3B, light can pass through the through hole 2021 in the shielding layer 202. Therefore, although monochrome pixels G1, G2, B1, and R1 are located below the shielding layer 202, as shown in FIG. 3C, in the top-view structure, structures of the monochrome pixels G1, G2, B1, and R1 may be observed through the through hole 2021.

In some possible implementations, the insulating structure is light-transmissive.

As shown in FIG. 3A, light emitted from the shielding layer 202 can pass through the region between the first electrode 2032 and the second electrode 2033 and continue to be propagated upward.

FIG. 3A shows possible distribution of the first electrodes 2032 and the second electrodes 2033 in the side-view structure of the display apparatus 200.

One electrode pair (including one first electrode 2032 and one second electrode 2033) is distributed above each monochrome pixel.

In a possible implementation, the electrode pair in the first control electrode layer 203 is opaque. Light is propagated upward after being emitted from the shielding layer 202, to reach the first control electrode layer 203. Because the electrode pair is opaque, in light emitted from the shielding layer 202, light with a large emergent angle is shielded by the first electrode 2032 and the second electrode 2033, and light with a small emergent angle passes through the region between the first electrode 2032 and the second electrode 2033 to continue to be propagated upward.

Because the region between the first electrode 2032 and the second electrode 2033 is light-transmissive, and the electrode pair is opaque, the first control electrode layer 203 may be considered as another shielding layer superimposed on the shielding layer 202.

An effect of shielding the first part of light can be improved by stacking the shielding layer 202 and the first control electrode layer 203 and by using a location relationship between the shielding layer 202 and the first control electrode layer 203. For example, the following location relationship between the shielding layer 202 and the first control electrode layer 203 is adjusted, so that an effect of shielding the first part of light by the shielding layer 202 and the first control electrode layer 203 is better than an effect of shielding the first part of light by the shielding layer 202: the plurality of through holes 2021 in the shielding layer 202 and the region between the first electrode 2032 and the second electrode 2033 in the first control electrode layer 203.

As shown in FIG. 3A, when light emitted from the OLED continues to be propagated upward after passing through the shielding layer 202, a part of the light is shielded by the first electrode 2032 and the second electrode 2033.

In the technical solution in this embodiment, the shielding layer 202 and the first control electrode layer 203 are stacked and adjusted. Compared with that a thickness of the shielding layer 202 in the z-axis direction is increased, the technical solution in this embodiment can be used to reduce a process difficulty, and further improve an effect of shielding light emitted from the OLED at a large angle.

The second control electrode layer 205 is made of a light-transmissive material, and can transmit light of all colors in some embodiments.

In conclusion, when the electrode pair in the first control electrode layer 203 is opaque, a shielding effect of the electrode pair on light further reduces the first part of light in light transmitted from below, that is, light emitted from the first control electrode layer 203 can be more approximately collimated light.

As shown in FIG. 3A, the ink particle layer 204 is located above the first control electrode layer 203.

Figure 3D:
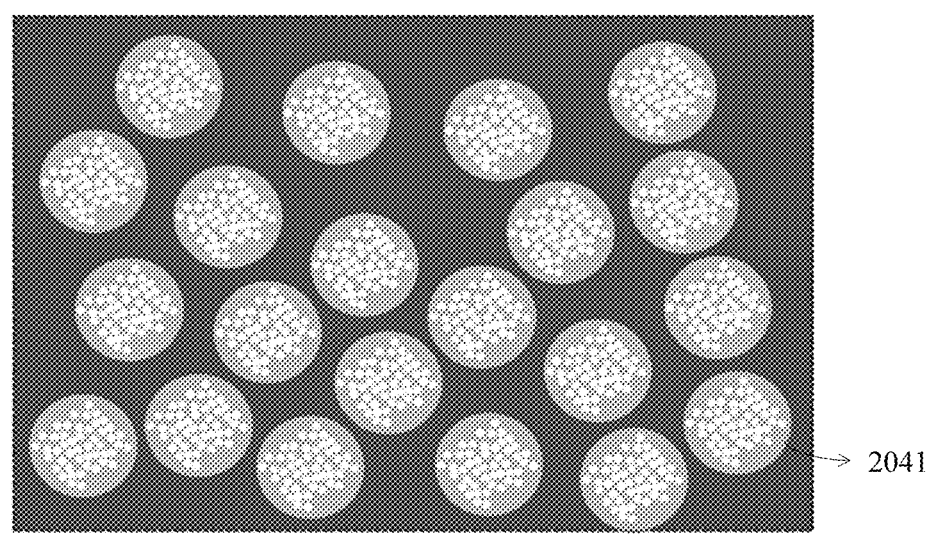
FIG. 3D is a schematic diagram of a top-view structure of an ink particle layer according to an embodiment of this application.

Referring to FIG. 3D, FIG. 3D is a schematic diagram of a top-view structure of an ink particle layer according to an embodiment of this application.

As shown in FIG. 3D, the ink particle layer 204 includes a plurality of ink capsules 2041. The plurality of ink capsules 2041 are randomly distributed in the ink particle layer 204.

In a possible implementation, the ink particle layer 204 may be a film structure that includes a plurality of ink capsules 2041.

Each ink capsule 2041 includes a plurality of charged ink particles, and each ink capsule 2041 may be considered as a small film structure.

When the ink particles are laid flat in the ink capsule 2041, light emitted from the first control electrode layer 203 is scattered when being projected onto the ink particles in the ink capsule 2041.

A location correspondence between the monochrome pixel and the ink capsule 2041 shown in FIG. 3A is merely an example. It can be understood that because the plurality of ink capsules 2041 are randomly distributed in the ink particle layer 204, the location correspondence between the ink capsule 2041 and the monochrome pixel in the OLED may alternatively have another case.

For example, another quantity of ink capsules 2041 (for example, two ink capsules 2041) may be distributed at a corresponding location above a monochrome pixel, or a part of an ink capsule 2041 may be distributed at a corresponding location above a monochrome pixel.

Under action of an electric field, a plurality of charged ink particles can move in an ink capsule 2041 to which the plurality of charged ink particles belong.

In a possible implementation, an ink capsule 2041 includes a solvent and a plurality of charged ink particles.

The solvent in the ink capsule 2041 is light-transmissive.

Further, in some possible cases, an ink capsule 2041 further includes a structure used to encapsulate the solvent and the plurality of charged ink particles.

As shown in FIG. 3A, the second control electrode layer 205 is located above the ink particle layer 204.

The second control electrode layer 205 is light-transmissive. Light transmitted to the second control electrode layer 205 from bottom to top is emitted through the second control electrode layer 205.

To more clearly describe a relationship between structures in the display apparatus 200, this embodiment provides a schematic diagram of a top-view structure in which an ink particle layer, a first electrode control layer, and a light-emitting panel are stacked.

Figure 3E:
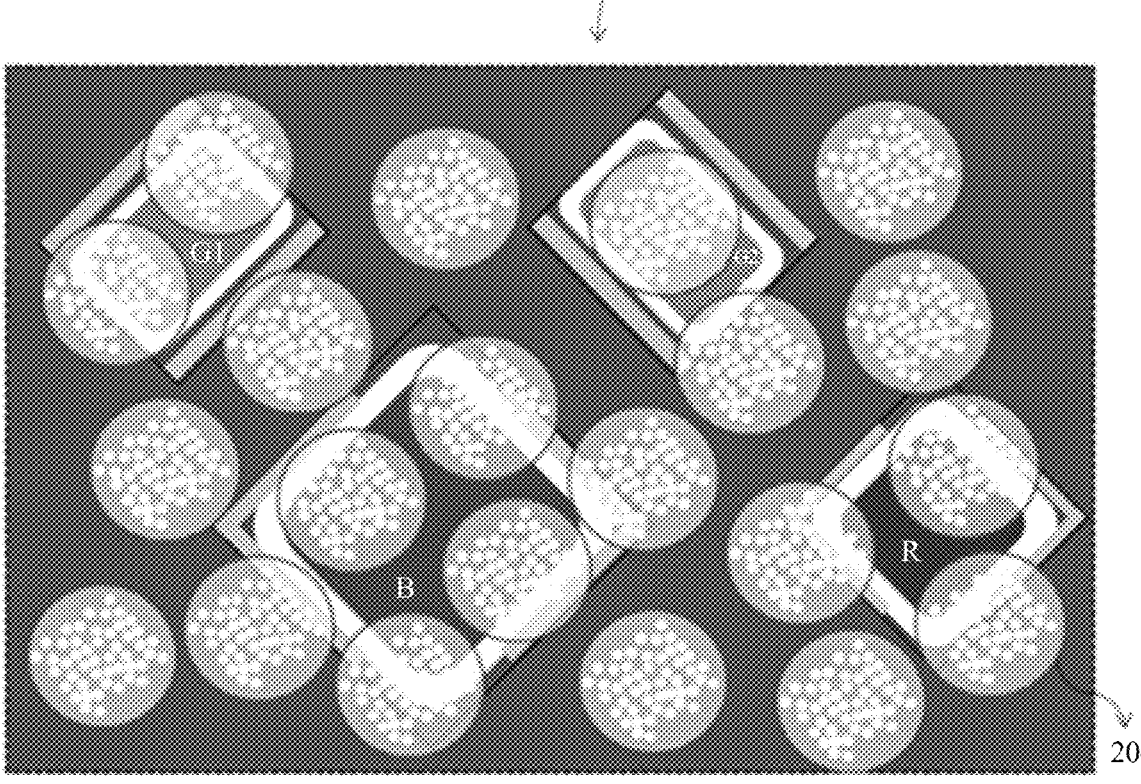
FIG. 3E is a schematic diagram of a top-view structure of a display apparatus according to an embodiment of this application.

Referring to FIG. 3E, FIG. 3E is a schematic diagram of a top-view structure of a display apparatus according to an embodiment of this application.

The second control electrode layer 205 is light-transmissive, and the insulating structure 2031 in the first control electrode layer 203 is light-transmissive. Therefore, the second control electrode layer 205 and the insulating structure 2031 are not shown in FIG. 3E.

With reference to FIG. 3C and FIG. 3D, FIG. 3E shows a top-view structure of a display apparatus corresponding to G1, G2, B1, and R1 in FIG. 3C.

Because the ink capsules 2041 are randomly distributed in the ink particle layer, in the top-view structure of the display apparatus 200, the ink capsules 2041 may not be in a one-to-one correspondence with the first electrodes, the second electrodes, and the monochrome pixels in terms of location relationship in the z-axis direction.

As shown in FIG. 3A, the ink particle layer 204 is located between the first control electrode layer 203 and the second control electrode layer 205.

The second control electrode layer 205 is light-transmissive.

An electric field can be formed at a location of the ink particle layer 204 by controlling voltages applied to electrodes in the first control electrode layer 203 and the second control electrode layer 205.

Because the ink particles in the ink capsule 2041 are charged, the ink particle can move in the electric field formed by the first control electrode layer 203 and the second control electrode layer 205.

Based on the foregoing description, the first part of light in light emitted from the OLED is shielded by the shielding layer 202 and the electrode pair in the first control electrode layer 203.

Therefore, light emitted from the first control electrode layer 203 is approximately collimated light, that is, the second part of light and the third part of light are approximately collimated light.

When the second part of light and the third part of light are not projected onto the ink particles in the ink particle layer 204, an emergent angle of light emitted from the ink particle layer 204 is small, and the light is approximately collimated light. In this case, an emergent angle of light emitted from the display apparatus 200 is small. Therefore, displayed content cannot be viewed from a side surface of the display apparatus 200, and the displayed content can be viewed only from a front surface of the display apparatus 200, so that the display apparatus 200 is in a peeping prevention state.

When the second part of light and the third part of light are projected onto the ink particles in the ink particle layer 204, the ink particles scatter the light, so that light emitted from the ink particle layer 204 is uniformly distributed at emergent angles. In this case, emergent angles of light emitted from the display apparatus 200 are uniformly distributed, and the display apparatus 200 is in a non-peeping prevention state.

In other words, in this embodiment of this application, the voltages applied to the electrodes in the first control electrode layer 203 and the second control electrode layer 205 can be controlled to control distribution of the ink particles in the ink particle layer 204, so as to control the display apparatus 200 to be in a peeping prevention state or a non-peeping prevention state.

In a possible implementation, when the electronic device receives a peeping prevention state switching instruction, the display apparatus 200 may switch from a non-peeping prevention state to a peeping prevention. When the electronic device receives a non-peeping prevention state switching instruction, the display apparatus 200 may switch from a peeping prevention state to a non-peeping prevention state.

Further, in a possible implementation, the peeping prevention state switching instruction received by the electronic device may be sent by a user who uses the electronic device.

That the display apparatus 200 is in a peeping prevention state is first described.

Figure 3F:
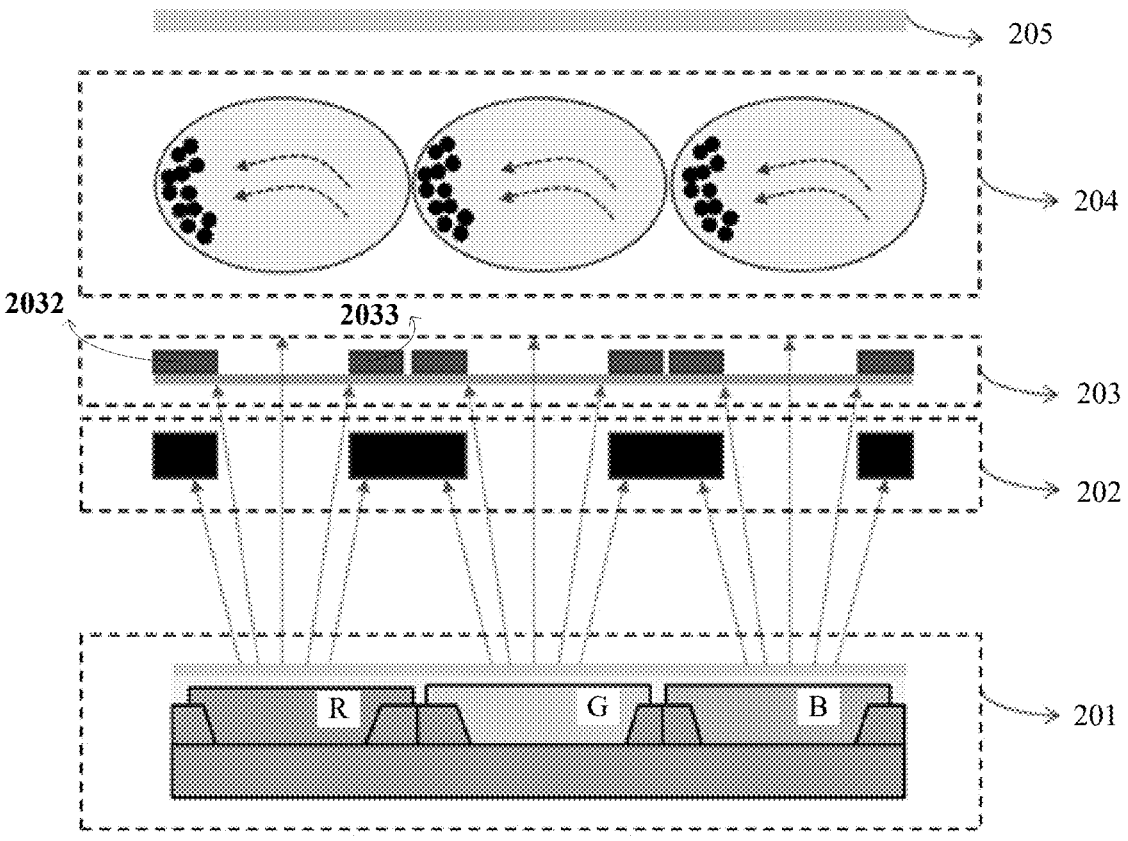
FIG. 3F is a schematic diagram of ink particle distribution in a peeping prevention state according to an embodiment of this application.

Referring to FIG. 3F, FIG. 3F is a schematic diagram of ink particle distribution in a peeping prevention state according to an embodiment of this application.

The following is an example in this embodiment.

As shown in FIG. 3F, the ink particles in the ink capsule are positively charged, the second control electrode layer 205 is not charged, the first electrode 2032 is negatively charged (for example, −10 V), and the second electrode 2033 is positively charged (for example, 10 V).

In this case, under action of the first electrode 2032 and the second electrode 2033, the ink particles in the ink capsule 2041 move toward a side close to the first electrode 2032 (as shown by an arrow direction in the ink capsule 2041 in FIG. 3F), and are distributed at a location close to the first electrode 2032 in the ink capsule 2041 when the ink particles are stable. The ink particles finally accumulate on a left side of the ink capsule.

The foregoing process may be considered as a process in which the ink particles are collected under driving of an electric field, to reduce or even avoid scattering of light (light that is emitted from the first control electrode 202 and that is approximately collimated) by the ink particles. Therefore, an emergent angle of light emitted from the ink particle layer 204 is small, an emergent angle of light emitted from the display apparatus 200 is small, and the display apparatus 200 is in a peeping prevention state.

The following describes the display apparatus 200 in a non-peeping prevention state.

Figure 3G:
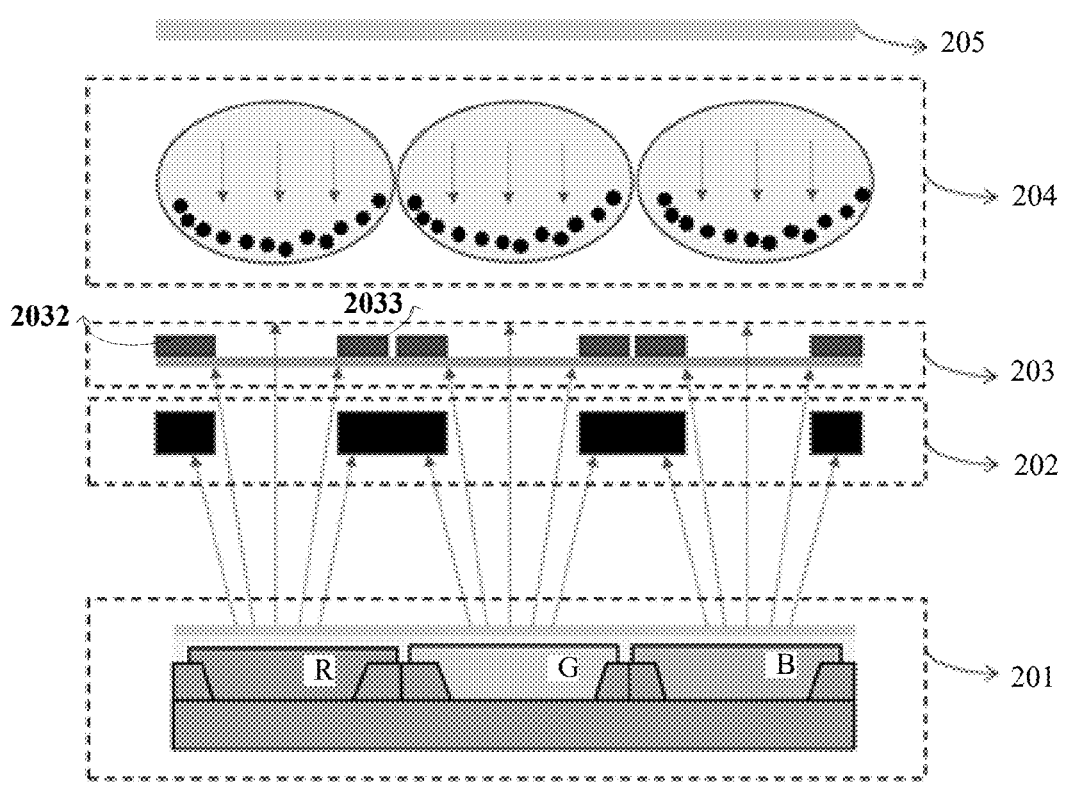
FIG. 3G is a schematic diagram of ink particle distribution in a non-peeping prevention state according to an embodiment of this application.

Referring to FIG. 3G, FIG. 3G is a schematic diagram of ink particle distribution in a non-peeping prevention state according to an embodiment of this application.

The following is an example in this embodiment.

As shown in FIG. 3G, the ink particles in the ink capsule are positively charged, the second control electrode layer 205 is positively charged (for example, 10 V), both the first electrode 2032 and the second electrode 2033 are negatively charged, and voltages of the first electrode 2032 and the second electrode 2033 are the same, (for example, −10 V).

In this case, under action of the second control electrode layer 205, the first electrode 2032, and the second electrode 2033, the ink particles in the ink capsule move in a direction away from the second control electrode layer 205 (as shown by an arrow direction in the ink capsule in FIG. 3G), and are laid flat at the bottom of the ink capsule when the ink particles are stable.

Although light emitted from the first control electrode 202 is approximately collimated light, after the light reaches the ink particle layer 204, the ink particles laid flat at the bottom of the ink capsule scatter the light, and emitted light includes both light emitted at a large angle and light emitted at a small angle. Light emitted from the ink particle layer 204 is uniformly distributed at emergent angles, emergent angles of light emitted from the display apparatus 200 are uniformly distributed, and the display apparatus 200 is in a non-peeping prevention state.

The foregoing process may be considered as a process in which the ink particles disperse under driving of an electric field, to implement scattering of light by the ink particles, so that the display apparatus 200 is in a non-peeping prevention state.

In some possible implementations, a size of the ink particle and combination of refractive indexes of the ink particle and the solvent in the ink capsule 204 may be adjusted to adjust a light scattering feature of the ink particle, so that the display apparatus 200 is in a non-peeping prevention state.

The following is an example in this embodiment. In the ink capsule 204, a refractive index of the solvent is less than 1.5, a refractive index of the ink particle is greater than 1.75, the size of the ink particle is approximately 10-100 nm, and a particle volume concentration is 3~20%.

In conclusion, the ink particles in the ink particle layer 204 can move under action of the electric field generated by the first control electrode layer 203 and the second control electrode layer 205, so that the display apparatus 200 is in a peeping prevention state or a non-peeping prevention state.

In a possible implementation, the ink particle has a feature of absorbing blue light and/or violet light (light with a high frequency) in a spectrum, to reduce a proportion of high-energy blue-violet light in the spectrum, so as to protect eyes of a user.

The following is an example of an ink particle material according to an embodiment of this application.

Considering the light absorption feature of the ink particle, a band gap of a base material of the ink particle may be approximately 2.8 eV (for example, the band gap is (2.6-3.0) eEV, and the material may be specifically tungsten oxide, bismuth oxide, titanium oxide, and a related derivative material).

Referring to FIG. 4A, FIG. 4A is a schematic diagram of a typical absorption spectrum of a scattering particle according to an embodiment of this application.

As shown in FIG. 4A, an absorption cutoff wavelength of the base material of the ink particle may be approximately 450 nm (for example, 445-455 nm).

When light emitted from the first control electrode layer is projected onto the ink particle, in addition to scattering the light, the ink particle further absorbs light whose wavelength is less than a cutoff wavelength (high-energy blue-violet light), so that the electronic device has a function of eye protection with low-blue light, to protect eye health of a user.

For example, when the user is in an outdoor scenario, the electronic device needs to perform display with large brightness.

In a possible implementation, a thickness of a cathode of the OLED may be increased, to enhance a microcavity effect to increase brightness of light emitted at a small angle.

In this embodiment, when the display panel 200 is the OLED, the thickness of the cathode of the OLED is increased to improve intensity of light emitted at a small angle.

Referring to FIG. 4B, FIG. 4B is a schematic diagram of a structure of an OLED according to an embodiment of this application.

As shown in FIG. 4B, the structure of the OLED mainly includes a flexible substrate, a total reflective anode, a hole transport layer/HTL, a microcavity adjustment layer, a monochrome pixel light-emitting layer/EML, an electron transport layer, and a translucent cathode.

In the OLED structure, the total reflective anode and the translucent cathode form a microcavity, and a thicker cathode indicates a stronger microcavity effect.

In some possible cases, a thickness of the cathode may be increased to 16~20 nm.

When the microcavity effect is enhanced, an emergent angle of light emitted from the OLED is smaller. To be specific, for the display panel, brightness of a front surface increases, brightness in an angle of view decreases, and a spectrum becomes narrow.

The shielding layer 202 and the first electrode layer 203 have a shielding effect on the first part of light. Therefore, in the technical solution in this embodiment, intensity of emergent light of the display apparatus 200 can be improved.

According to the technical solution in this application, in the display apparatus of the electronic device, the display panel, the shielding layer, the first control electrode layer, the ink particle layer, and the light-transmissive second control electrode layer are sequentially arranged from bottom to top. When a peeping prevention function is implemented, the shielding layer shields the first part of light emitted from the display panel, and the light adjustment layer controls the ink particles to accumulate on one of the left side or the right side of the ink capsule in which the ink particles are located, so that light passing through the through hole in the shielding layer directly passes through the ink capsule and is not scattered. The acute angle between the shielded first part of light and the plane on which the display panel is located is less than the preset angle, the acute angle between the second part of light passing through the through hole and the plane on which the display panel is located is greater than or equal to the preset angle, and the third part of light passing through the through hole is perpendicular to the plane on which the display panel is located, that is, the second part of light and the third part of light are collimated light, so that light passing through the ink capsule is also collimated light. Therefore, displayed content cannot be viewed from a side surface of the display apparatus, and the displayed content can be viewed only from a front surface of the display apparatus, thereby implementing a peeping prevention function.

When the display apparatus does not need to implement peeping prevention, and switches to a non-peeping prevention state, the light adjustment layer controls the ink particles to be laid flat, in the ink capsule in which the ink particles are located, in the direction parallel to the plane on which the display panel is located, so that the ink particles scatter the second part of light and the third part of light that pass through the through hole in the shielding layer, and after being emitted from the light adjustment layer, the second part of light and the third part of light change from collimated light to light having a plurality of different emergent angles. In this case, light emitted from the light adjustment layer includes both light emitted at a small angle and light emitted at a large angle, to help a user view displayed content on the display apparatus at different angles. In conclusion, according to the solution provided in this application, the electronic device has a peeping prevention function and a non-peeping prevention function, and can switch between the two functions based on a requirement of a user.

In addition, the ink particle in the ink capsule may be made of a material that can absorb blue-violet light. In this case, in addition to scattering light, the ink particle further absorbs light whose wavelength is less than a cutoff wavelength (high-energy blue-violet light), so that the electronic device has a function of eye protection with low-blue light, to protect eye health of a user.

In the foregoing embodiment, the light shielding structure in the shielding layer is a light shielding layer. In another possible implementation, the light shielding structure may alternatively be a plurality of shielding members arranged in an array.

Referring to FIG. 5, FIG. 5 is a partial schematic diagram of a side-view structure of a display apparatus according to another embodiment of this application.

As shown in FIG. 5, a display apparatus 200 includes a display panel 201, a shielding layer 202, a first control electrode layer 203, an ink particle layer 204, and a second control electrode layer 205, and the structures are sequentially disposed from bottom to top.

For the display panel 201, the first control electrode layer 203, the ink particle layer 204, and the second control electrode layer 205, refer to the descriptions in the foregoing embodiment. Details are not described herein again.

A light shielding structure in the shielding layer 202 is a plurality of shielding members 2023.

As shown in FIG. 5, the first control electrode layer 203 includes an insulating structure 2031 and a plurality of electrode pairs. One electrode pair includes one first electrode 2032 and one second electrode 2033.

The insulating structure 2031 may be configured to fasten the plurality of electrode pairs.

For an electrode pair, the first electrode 2032 and the second electrode 2033 are disposed opposite to each other on an xoy plane.

A region between the first electrode 2032 and the second electrode 2033 is light-transmissive.

The shielding layer 202 includes a plurality of shielding members 2023. The shielding member 2023 is opaque.

A shielding member is disposed below each first electrode 2032 and each second electrode 2033.

The shielding member is in a surrounding shape, and the shielding member forms a hollow region through surrounding. The hollow region is a through hole, and the through hole is configured to allow a second part of light and a third part of light to pass through. An acute angle between the second part of light and a plane on which the display panel is located is greater than or equal to a preset angle, and the third part of light is perpendicular to the plane on which the display panel is located. For a specific process, refer to a principle of shielding light by the light shielding layer 2022 in the display apparatus 200 shown in FIG. 3A. Details are not described herein again.

In a possible implementation, black shielding members are distributed directly below the first electrode 2032 and the second electrode 2033. The black shielding member is made of an opaque material.

In some possible implementations, below each electrode pair (including one first electrode 2032 and one second electrode 2033) in the shielding layer 202, the black shielding member may further be in a surrounding shape, and the black shielding member forms a through hole through surrounding. In this case, through holes formed by a plurality of black shielding members through surrounding are similar to the through holes 2021 shown in FIG. 3B, so that the second part of light and the third part of light emitted from the OLED can pass through.

The plurality of black shielding members in a surrounding shape are located directly above corresponding monochrome pixels.

Below an electrode pair, a plurality of black shielding members are in a surrounding shape to form a hollow region, to implement a principle of shielding light emitted from the OLED at a large angle. This is similar to the structure of the shielding layer 202 shown in FIG. 3B, and details are not described herein again.

When a plurality of black shielding members are in a surrounding shape to form a hollow region below an electrode pair, a peeping prevention effect can be achieved in each direction on the xoy plane.

It can be understood that below each electrode pair, whether the black shielding members are located only below the first electrode 2032 and the second electrode 2033 or a plurality of black shielding members are in a surrounding shape may be set based on a peeping prevention requirement.

The implementation of shielding light by using the black shielding member is simple and convenient.

The structure of the display apparatus is described above. In the foregoing embodiments, the plurality of ink capsules in the ink particle layer are randomly distributed in the ink particle layer.

In some possible implementations, the ink capsules in the ink particle layer may be regularly distributed.

Referring to FIG. 6, FIG. 6 is a partial schematic diagram of a side-view structure of a display apparatus according to another embodiment of this application.

A display apparatus 200 shown in FIG. 6 is similar to that in FIG. 3A, and only a difference is described in this embodiment. For description of another structure in FIG. 6, refer to the description of FIG. 3A.

As shown in FIG. 6, the display apparatus 200 includes a display panel 201, a shielding layer 202, a first control electrode layer 203, an ink particle layer 204, and a second control electrode layer 205.

The display panel 201, the shielding layer 202, the first control electrode layer 203, the ink particle layer 204, and the second control electrode layer 205 are sequentially distributed from bottom to top.

The first control electrode layer 203 includes an insulating structure 2031 and a plurality of electrode pairs. The insulating structure 2031 may be configured to fasten the plurality of electrode pairs.

For an electrode pair, a first electrode 2032 and a second electrode 2033 are disposed opposite to each other on an xoy plane.

As shown in FIG. 6, one or more electrode pairs are distributed above each monochrome pixel. One electrode pair includes one first electrode 2032 and one second electrode 2033.

Light emitted from the shielding layer 202 can pass through a region between the first electrode 2032 and the second electrode 2033, to continue to be propagated upward.

As shown in FIG. 6, the ink particle layer 204 is located above the first control electrode layer 203.

The ink particle layer 204 includes a plurality of ink capsules 2041. Each ink capsule 2041 includes a plurality of charged ink particles.

One electrode pair in the first control electrode layer 203 corresponds to one ink capsule 2041 in the ink particle layer 204.

In a possible implementation, the ink particle layer 204 includes a plurality of ink capsules, for example, an ink capsule 2041a and an ink capsule 2041b in the figure, and further includes a base structure 2042.

The base structure 2042 may be light-transmissive. The ink capsule may be embedded in the base structure 2042. An ink capsule may be considered as a microcup carrying ink particles.

In some possible implementations, a hole may be dug on the base structure 2042, where the hole may be a through hole or a blind hole, and one ink capsule is filled in each hole to form the ink particle layer 204. In some embodiments, when the hole is a blind hole, the base structure 2042 is made of a light-transmissive material.

There is a one-to-one correspondence between the ink capsule and the electrode pair (one first electrode 2032 and one second electrode 2033).

When an electric field is formed at a location of the ink particle layer 204 by using the first control electrode layer 203 and the second control electrode 205, the charged ink particles in the ink capsule move under action of the electric field.

Voltages applied to electrodes in the first control electrode layer 203 and the second control electrode layer 205 can be controlled to control distribution of the ink particles in the ink particle layer 204, so as to control the display apparatus 200 to be in a peeping prevention state or a non-peeping prevention state. A principle of controlling the display apparatus 200 to be in a peeping prevention state or a non-peeping prevention state is the same as that in the foregoing embodiment, and details are not described herein again.

For location setting of the first control electrode layer 203, one or more electrode pairs are distributed above each monochrome pixel.

For a case in which a plurality of electrode pairs are distributed above each monochrome pixel, the following uses an example in which two electrode pairs are distributed above one monochrome pixel for description.

As shown in FIG. 6, two electrode pairs are distributed above a red pixel R, which are respectively a first electrode pair and a second electrode pair.

The first electrode pair includes a first electrode 2032a and a second electrode 2033a, and the second electrode pair includes a first electrode 2032b and a second electrode 2033b.

The first electrode 2032a, the second electrode 2033a, the first electrode 2032b, and the second electrode 2033b are sequentially arranged on the xoy plane.

The first electrode 2032a and the second electrode 2033a are disposed opposite to each other, and an electric field can be formed between the first electrode 2032a and the second electrode 2033a.

The first electrode 2032b and the second electrode 2033b are disposed opposite to each other, and an electric field can be formed between the first electrode 2032b and the second electrode 2033b.

Two ink capsules are distributed above the red pixel R, which are respectively an ink capsule 2041a and an ink capsule 2041b.

A location of the ink capsule 2041a is above a region between the first electrode 2032a and the second electrode 2033*a*, and a location of the ink capsule 2041*b* is above a region between the first electrode 2032*b* and the second electrode 2033*b*.

Based on the foregoing description, an electric field can be formed at the location of the ink particle layer 204 by using the first control electrode layer 203 and the second control electrode layer 205, so that the ink particles move.

Specifically, an electric field is formed at a location of the ink capsule 2041*a* by using the first electrode 2032*a*, the second electrode 2033*a*, and the second control electrode layer 205, so that ink particles in the ink capsule 2041*a* move.

An electric field is formed at a location of the ink capsule 2041*b* by using the first electrode 2032*b*, the second electrode 2033*b*, and the second control electrode layer 205, so that ink particles in the ink capsule 2041*b* move.

The ink capsule 2041*a* and the ink capsule 2041*b* move in the electric field, so that the display apparatus 200 is separately in a peeping prevention state or a non-peeping prevention state. A principle is similar to that in the foregoing embodiment, and reference can be made to the description in the foregoing embodiment. Details are not described herein again.

The following may be set: One monochrome pixel in the OLED corresponds to a plurality of electrode pairs in the first control electrode layer 203, one monochrome pixel in the OLED corresponds to a plurality of ink capsules 2041 in the ink particle layer 204, and the electrode pairs are in a one-to-one correspondence with the ink capsules 2041.

When the monochrome pixel occupies a large area on the xoy plane, if one monochrome pixel corresponds to one electrode pair, a distance between the first electrode 2032 and the second electrode 2033 in the electrode pair is long, and voltages that are applied to the first electrode and the second electrode and that are used to control movement of the ink particle are large.

It is set that one monochrome pixel corresponds to a plurality of electrode pairs, to shorten the distance between the first electrode 2032 and the second electrode 2033, and reduce the voltages that are applied to each first electrode 2032 and each second electrode 2033 and that are used to control movement of the ink particle.

According to the technical solution in this embodiment, for a location relationship between the first control electrode layer and the ink particle layer, it is set that the ink capsules in the ink particle layer are in a one-to-one correspondence with the electrode pairs in the first control electrode layer. The ink capsule is distributed above the region between the first electrode and the second electrode in the electrode pair. The ink particles in the ink capsule move in an electric field formed by the first control electrode layer and the second control electrode layer, so that the display apparatus is in a peeping prevention state or a non-peeping prevention state. There is a clear location correspondence between the ink capsule and the electrode pair, which can improve accuracy of controlling movement of the ink particle in the ink capsule.

The technical solution in this embodiment can be used to further increase use of brightness of a front surface of a pixel light-emitting region, and reduce impact caused on a peeping prevention effect and brightness of the front surface by accumulation of the ink particles on the front surface due to random distribution.

It may be set that one monochrome pixel corresponds to a plurality of electrode pairs to reduce a voltage applied to the electrode pair and used to control movement of the ink particle.

In the foregoing embodiment, different distribution of the ink capsules in the ink particle layer is described. In a possible implementation, different ink capsules in the ink particle layer of the display apparatus may be distributed in a plurality of different manners.

Still referring to FIG. 3A, the voltages applied to the electrodes in the first electrode layer 203 and the second electrode layer 205 can be controlled to control the ink particles in the ink particle layer 204, so as to control light emitted from the display apparatus 200 to be approximately collimated light, or control light emitted from the display apparatus 200 to have a uniform emergent angle.

The following is a schematic diagram of a circuit for controlling the first electrode layer 203 according to an embodiment of this application.

The first electrode layer 203 includes a plurality of electrode pairs, and each electrode pair includes one first electrode 2032 and one second electrode 2033.

Referring to FIG. 7A, FIG. 7A is a schematic diagram of a first electrode layer and a first control circuit according to an embodiment of this application.

FIG. 7A is a schematic diagram, in a top-view direction of the display apparatus 200, of a first electrode and a second electrode in a first electrode layer and a circuit used to control the first electrode and the second electrode.

FIG. 7A is a schematic diagram of structures of four electrode pairs in the top-view direction of the display apparatus 200.

It can be understood that although FIG. 7A shows the structures of only four electrode pairs in the display apparatus 200, the structure of the electrode pair may be extended according to an arrangement rule for pixels on the imaging panel 201.

As shown in FIG. 7A, the four electrode pairs are respectively a first electrode pair, a second electrode pair, a third electrode pair, and a fourth electrode pair.

The first electrode pair includes a first electrode 2032*a* and a second electrode 2033*a*, the second electrode pair includes a first electrode 2032*b* and a second electrode 2033*b*, the third electrode pair includes a first electrode 2032*c* and a second electrode 2033*c*, and the fourth electrode pair includes a first electrode 2032*d* and a second electrode 2033*d*.

As shown in FIG. 7A, electrodes in the first electrode pair and the second electrode pair are "--" shaped electrodes, and electrodes in the third electrode pair and the fourth electrode pair are "L" shaped electrodes.

It can be understood that in this embodiment, the shape of the electrode shown in FIG. 7A is used as an example to describe a control circuit of the first electrode layer. However, the electrode may alternatively be of any other shape, and the shape of the electrode does not affect implementation of this embodiment.

As shown in FIG. 7A, a first circuit A, a second circuit B, and a third circuit C are used to provide a constant voltage for the electrode pair, to control a status of the ink particle in the ink particle layer 204, so that the display apparatus 200 is in a peeping prevention state or a non-peeping prevention state.

Specifically, the first circuit A provides a voltage for the first electrode 2032*a* and the first electrode 2032*b*; the second circuit B provides a voltage for the second electrode 2033*a*, the second electrode 2033*b*, the second electrode 2033*c*, and the second electrode 2033*d*; and the third circuit C provides a voltage for the first electrode 2032*c* and the first electrode 2032*d*.

Both the first circuit A and the third circuit C are configured to provide a voltage for the first electrode 2032, and the first circuit A and the third circuit C may be configured to provide a same voltage.

In a possible implementation, the first circuit A, the second circuit B, and the third circuit C each are connected to a corresponding electrode by using a connection point 2034, to provide a voltage for the corresponding electrode.

FIG. 7A shows only a connection point between the first circuit A and the first electrode 2032. It can be understood that when the circuit provides a voltage for another electrode, a connection point 2034 may also exist.

The following respectively describes methods for implementing that the display apparatus 200 is in a peeping prevention state and a non-peeping prevention state.

As shown in FIG. 3A, based on the description in the foregoing embodiment, for light that is emitted from the first electrode layer 203 and that is approximately collimated, the ink particles are controlled not to scatter the light, so that the display apparatus 200 is in a peeping prevention state.

The following is an example in this embodiment.

For example, the ink particles in the ink capsule 2041 are positively charged, and the second control electrode layer 205 is controlled to be not charged.

The first circuit A provides a constant voltage of $-10\,\text{V}$ for the first electrode 2032*a* and the first electrode 2032*b*. The second circuit B provides a constant voltage of $10\,\text{V}$ for the second electrode 2033*a*, the second electrode 2033*b*, the second electrode 2033*c*, and the second electrode 2033*d*. The third circuit C provides a constant voltage of the $-10\,\text{V}$ for the first electrode 2032*c* and the first electrode 2032*d*.

In this case, under action of the second control electrode layer 205, the first electrode 2032, and the second electrode 2033, the ink particles in the ink capsule 2041 move toward a side close to the first electrode 2032, and are distributed at a location close to the first electrode 2032 in the ink capsule 2041 when the ink particles are stable. The ink particles are collected under action of an electric field, to reduce or even avoid scattering of light by the ink particles, so that the display apparatus 200 is in a peeping prevention state.

For example, the ink particles in the ink capsule 2041 are positively charged, and the second control electrode layer 205 is controlled to be positively charged (for example, 10 V).

The first circuit A, the second circuit B, and the third circuit C provide a constant voltage of $-10\,\text{V}$ for the first electrode 2032*a*, the first electrode 2032*b*, the first electrode 2032*c*, the first electrode 2032*d*, the second electrode 2033*a*, the second electrode 2033*b*, the second electrode 2033*c*, and the second electrode 2033*d*.

In this case, under action of the second control electrode layer 205, the first electrode 2032, and the second electrode 2033, the ink particles in the ink capsule 2041 move toward a side close to the first electrode 2032, and are distributed at a location close to the first electrode 2032 in the ink capsule 2041 when the ink particles are stable. The ink particles are collected under action of an electric field, to reduce or even avoid scattering of light by the ink particles, so that the display apparatus 200 is in a peeping prevention state.

In this case, under action of the second control electrode layer 205, the first electrode 2032, and the second electrode 2033, the ink particles in the ink capsule 2041 move in a direction away from the second control electrode layer 205, and are laid flat at the bottom of the ink capsule 2041 when the ink particles are stable. The ink particles disperse under action of an electric field, so that the ink particles scatter light, and the display apparatus 200 is in a non-peeping prevention state.

In a possible implementation, both the first circuit A and the third circuit C provide a voltage for the first electrode 2032, the first circuit and the third circuit C provide a first voltage V1 for the first electrode 2032, and the second circuit B provides a second voltage V2 for the second electrode 2033.

Referring to FIG. 7B, FIG. 7B is a schematic diagram of a first control circuit according to an embodiment of this application.

FIG. 7B is a schematic diagram, in a top-view direction of the display apparatus, of a structure obtained after the first control circuit in FIG. 7A is partially extended.

As shown in FIG. 7B, the first control circuit includes two parts. One part is configured to provide a first voltage V1 for the first electrode 2032, and the other part is configured to provide a second voltage V2 for the second electrode 2033.

It can be understood that FIG. 7B is merely a schematic diagram of a structure of the first control circuit, and is a schematic diagram of a partial structure. The first control circuit may be extended according to a pixel arrangement rule, as shown by " . . . " in the figure.

In a possible implementation, distribution of the first control circuit and a structure direction of an electronic device have a correspondence shown in FIG. 7B.

As shown in FIG. 7B, for example, the electronic device is a mobile phone. FIG. 7B shows a possible case of a correspondence between a vertical direction of the mobile phone and distribution of the first control circuit.

In some possible cases, an integrated circuit of the display apparatus may be located below FIG. 7B, that is, on a side in the vertical direction of the mobile phone.

The foregoing describes a constant voltage that may be provided for the electrode in the first electron layer, to control the status of the ink particle, that is, the constant voltage is used for driving.

In a possible implementation, the ink particle may alternatively be controlled by driving a circuit to perform scanning.

Referring to FIG. 8A, FIG. 8A is a schematic diagram of a first control circuit according to another embodiment of this application.

FIG. 8A is a schematic diagram, in a top-view direction of the display apparatus 200, of a circuit used to drive movement of an ink particle.

As shown in FIG. 8A, the control circuit includes a plurality of control units. Each control unit is configured to control one electrode pair (the first electrode and the second electrode) in the first control electrode layer.

Arrangement of the plurality of control units in the control circuit is shown in FIG. 8A. It can be understood that FIG. 8A is merely a schematic diagram of the first control circuit. FIG. 8A shows a partial structure of the first control circuit, and the control unit in the first control circuit may be extended in a manner shown in the figure.

Referring to FIG. 8B, FIG. 8B is a schematic diagram of a control unit according to an embodiment of this application.

FIG. 8B shows two control units in FIG. 8A and a specific structure of the control unit.

Referring to FIG. 8A and FIG. 8B, the control unit includes a thin film transistor TFT (Thin Film Transistor) and a capacitor.

The TFT includes a gate, a source, and a drain. A working principle of the TFT is as follows: A voltage is injected into the gate of the TFT to control a current between the source and the drain.

In the first control electrode layer, each first electrode and each second electrode is driven by the thin film transistor TFT. In other words, in the first control electrode layer, each first electrode and each second electrode corresponds to one TFT.

An ink particle capacitor in the control unit shown in FIG. 8B is not a real circuit element in the control unit, and the ink particle capacitor is generated by movement of the ink particle and is configured to maintain balanced with the capacitor.

As shown in FIG. 8A, for some of the plurality of control units, gates of TFTs of control units in the some control units are connected, that is, the gates of the TFTs of the control units are connected to G1, G2, . . . , and Gn.

For some of the plurality of control units, sources of TFTs of control units in the some control units are connected, that is, the sources of the TFTs of the control units are connected to S1-1, S1-2, S2-1, S2-2, . . . , Sn-1, and Sn-2.

" . . . " indicates that the structure of the control circuit can be spatially extended based on a similar structure.

The first electrode and the second electrode are controlled through progressive scanning.

Specifically, G1, G2, . . . , and Gn are scanned.

For example, when G1 is scanned, the source of the TFT of the control unit is powered on, so that S1-1, S1-2, S2-1, S2-2, . . . , Sn-1, and Sn-2 are sequentially used to provide a voltage for the electrode in the first control electrode layer. When scanning of G1 is completed and G2 is scanned, the source of the TFT of the control unit is powered on, so that S1-1, S1-2, S2-1, S2-2, . . . , Sn-1, and Sn-2 are sequentially used to provide a voltage for the electrode in the first control electrode layer.

Specifically, S1-1, S2-1, . . . , and Sn-1 provide a voltage for the first electrode in the first control electrode layer, and S1-2, S2-2, . . . , and Sn-2 provide a voltage for the second electrode in the first control electrode layer.

A voltage is provided for the electrode through scanning to reduce power consumption.

The capacitor is configured to keep a charged voltage until next time of scanning arrives.

Different from the foregoing embodiment, in this embodiment, a constant voltage is not applied to the electrode, and instead, a voltage is applied through scanning, to reduce power consumption generated when a voltage is provided for the electrode.

An embodiment of this application further provides an electronic device.

A type of the electronic device is not specifically limited in this embodiment of this application, and the electronic device may be a used mobile phone, a notebook computer, a wearable electronic device (for example, a smartwatch), a tablet computer, an augmented reality (augmented reality, AR) device, a virtual reality (virtual reality, VR) device, or the like.

Referring to FIG. 1A, FIG. 1A shows a structure of the electronic device in this embodiment.

The display device 200 in the foregoing embodiments of this application is applied to the electronic device 100 shown in FIG. 1A, and may implement a function of the display 194 in FIG. 1A.

The electronic device 100 may include one or more display apparatuses 200 provided in the embodiments. When the electronic device 100 includes a plurality of display apparatuses 200, the plurality of display apparatuses may be configured to implement a display function of one or more surfaces of the electronic device.

When a user uses the electronic device 100 in different scenarios, for example, the user separately uses the electronic device 100 in an outdoor scenario and a home scenario, the user has different requirements for a display function of the electronic device 100.

Generally, in the outdoor scenario, the electronic device 100 needs to have a peeping prevention function; and in the home scenario, the electronic device 100 needs to have a large display angle.

When the display apparatus of the electronic device provided in this embodiment of this application, implements a peeping prevention function, the shielding layer shields the first part of light emitted from the display panel, and the light adjustment layer controls the ink particles to accumulate on one of the left side or the right side of the ink capsule in which the ink particles are located, so that light passing through the shielding layer directly passes through the ink capsule and is not scattered. Because the acute angle between the shielded first part of light and the plane on which the display panel is located is less than the preset angle, displayed content cannot be viewed from a side surface of the display apparatus, and the displayed content can be viewed only from a front surface of the display apparatus, thereby implementing a peeping prevention function. When the display apparatus does not need to implement peeping prevention, and switches to a non-peeping prevention state, the light adjustment layer controls the ink particles to be laid flat, in the ink capsule in which the ink particles are located, in the direction parallel to the plane on which the display panel is located, so that the ink particles scatter the second part of light and the third part of light that pass through the through hole in the shielding layer, and after being emitted from the light adjustment layer, the second part of light and the third part of light change from collimated light to light having a plurality of different emergent angles. In this case, light emitted from the light adjustment layer includes both light emitted at a small angle and light emitted at a large angle, to help a user view displayed content on the display apparatus at different angles. In conclusion, according to the solution provided in this application, the electronic device has a peeping prevention function and a non-peeping prevention function, and can switch between the two functions based on a requirement of a user. In addition, the ink particle with a feature of absorbing blue-violet light is used, so that when light emitted from the first control electrode layer is projected onto the ink particle, the blue-violet light is absorbed by the ink particle. Therefore, the electronic device has a function of eye protection with low-blue light, to protect eye health of a user.

Embodiments of this specification are described in a progressive manner, and for the same and similar parts of embodiments, reference may be made to each other. Each embodiment focuses on a difference from other embodiments. The apparatus embodiments described above are merely examples, and the units and modules described as separate parts may or may not be physically separate. In addition, some or all of the units and modules may be selected based on an actual requirement to achieve the objectives of the solutions in embodiments. A person of ordinary skill in the art can understand and implement the solutions without creative efforts.

The foregoing descriptions are merely specific implementations of this application. It should be noted that a person of ordinary skill in the art can further make several improvements and polishing without departing from the principle of this application, and the improvements and polishing shall fall within the protection scope of this application.

What is claimed is:

1. A display apparatus, applied to an electronic device, wherein the display apparatus comprises a display panel, a shielding layer, and a light adjustment layer that are sequentially stacked from bottom to top;

a plurality of monochrome pixels are distributed on the display panel, and the display panel is configured to emit light;

the shielding layer comprises a light shielding structure and a plurality of through holes, the light shielding structure is configured to shield a first part of light, the plurality of through holes are configured to allow a second part of light and a third part of light to pass through, an acute angle between the first part of light and a plane on which the display panel is located is less than a preset angle, an acute angle between the second part of light and the plane on which the display panel is located is greater than or equal to the preset angle, and the third part of light is perpendicular to the plane on which the display panel is located;

the light adjustment layer comprises a plurality of ink capsules, and each ink capsule comprises a plurality of ink particles; and the light adjustment layer is configured to: control the ink particles to accumulate on one of a left side or a right side of the ink capsule in which the ink particles are located, so that the second part of light and the third part of light in the shielding layer directly pass through the ink capsule; or control the ink particles to be laid flat, in the ink capsule in which the ink particles are located, in a direction parallel to the plane on which the display panel is located, so that the ink particles scatter the second part of light and the third part of light in the shielding layer.

2. The display apparatus according to claim 1, wherein the light adjustment layer comprises a first control electrode layer, an ink particle layer, and a second control electrode layer that are sequentially stacked in a direction away from the shielding layer;

the first control electrode layer comprises a plurality of electrode pairs, each electrode pair comprises a first electrode and a second electrode, the first electrodes and the second electrodes are laid flat in the direction parallel to the plane on which the display panel is located, and light passing through the shielding layer can pass through a region between the first electrode and the second electrode;

the ink particle layer comprises the plurality of ink capsules;

the second control electrode layer is made of a light-transmissive material; and the first control electrode layer is configured to carry no charge, and the first electrode and the second electrode are configured to generate a voltage difference, to control the ink particles to accumulate on one of the left side or the right side of the ink capsule in which the ink particles are located; and the first control electrode layer is further configured to carry a charge of a same type as a charge of the ink particle, and the first electrode and the second electrode each are further configured to carry a charge of a type different from that of the charge of the ink particle, to control the ink particles to be laid flat, in the ink capsule in which the ink particles are located, in the direction parallel to the plane on which the display panel is located.

3. The display apparatus according to claim 2, wherein each electrode pair in the first control electrode layer is made of an opaque material.

4. The display apparatus according to claim 2, wherein the first control electrode layer further comprises an insulating structure;

the insulating structure is made of a transparent material; and the plurality of electrode pairs are etched on the insulating structure.

5. The display apparatus according to claim 1, wherein the light shielding structure is a light shielding layer;

the light shielding layer is made of an opaque material; and the light shielding layer comprises the plurality of through holes.

6. The display apparatus according to claim 5, wherein a location of each through hole corresponds to one monochrome pixel on the display panel.

7. The display apparatus according to claim 2, wherein the light shielding structure is a plurality of shielding members arranged in an array;

each shielding member is made of an opaque material;

each shielding member is distributed below the first electrode and the second electrode; and each shielding member is in a surrounding shape and forms one of the plurality of through holes through surrounding.

8. The display apparatus according to claim 7, wherein a location of each through hole corresponds to one monochrome pixel on the display panel.

9. The display apparatus according to claim 7, wherein a location of each through hole corresponds to one or more monochrome pixels on the display panel, and at least two electrode pairs are disposed at a corresponding location in the first control electrode layer above each through hole.

10. The display apparatus according to claim 2, wherein the plurality of ink capsules comprised in the ink particle layer are laid flat in the direction parallel to the plane on which the display panel is located.

11. The display apparatus according to claim 2, wherein the ink particle layer further comprises a base structure;

the base structure is made of a light-transmissive material, and the base structure comprises a plurality of blind holes; and each blind hole is configured to fill one or more ink capsules.

12. The display apparatus according to claim 2, wherein the ink particle layer further comprises a base structure;

the base structure comprises a plurality of through holes; and each through hole is configured to fill one or more ink capsules.

13. The display apparatus according to claim 2, wherein the first control electrode layer further comprises a first control circuit;

the first control circuit comprises a first branch and a second branch that are arranged at intervals, and a quantity of the first branches is equal to a quantity of the second branches;

the plurality of electrode pairs comprise a plurality of groups of electrode pairs;

each first branch is configured to supply power to a first electrode in one group of electrode pairs; and each second branch is configured to supply power to a second electrode in one group of electrode pairs.

14. The display apparatus according to claim 13, wherein the first control circuit further comprises a plurality of control units, and each control unit is configured to drive one electrode pair; and each control unit comprises one thin film transistor and one capacitor.

15. The display apparatus according to claim 1, wherein the ink particle is made of one or more of the following materials:

tungsten oxide, bismuth oxide, or titanium oxide.

16. The display apparatus according to claim 1, wherein a light-absorbing cutoff wavelength range of the ink particle is 445 nanometers to 455 nanometers.

17. An electronic device, wherein the electronic device comprises the display apparatus according to claim 1.

* * * * *